(12) United States Patent
Sim et al.

(10) Patent No.: US 11,165,001 B2
(45) Date of Patent: Nov. 2, 2021

(54) LIGHT EMITTING DISPLAY APPARATUS

(71) Applicant: LG DISPLAY CO., LTD., Seoul (KR)

(72) Inventors: Dongmin Sim, Paju-si (KR);
Hyekyung Choi, Seoul (KR);
Kyunghoon Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/930,086

(22) Filed: May 12, 2020

(65) Prior Publication Data
US 2020/0365776 A1 Nov. 19, 2020

(30) Foreign Application Priority Data
May 17, 2019 (KR) .................. 10-2019-0058188

(51) Int. Cl.
*H01L 33/54* (2010.01)
*H01L 27/15* (2006.01)
*H01L 27/32* (2006.01)

(52) U.S. Cl.
CPC ............ *H01L 33/54* (2013.01); *H01L 27/156* (2013.01); *H01L 27/3246* (2013.01)

(58) Field of Classification Search
CPC . H01L 33/54; H01L 27/3246; H01L 51/5271; H01L 51/5209; H01L 51/5225
See application file for complete search history.

(56) References Cited

U.S. PATENT DOCUMENTS

| 2014/0291648 A1* | 10/2014 | Yamazaki | ............ H01L 51/525 257/40 |
| 2014/0353595 A1* | 12/2014 | Choi | .................. H01L 27/3246 257/40 |

FOREIGN PATENT DOCUMENTS

| KR | 10-2013-0085195 A | 7/2013 |
| KR | 10-2015-0118662 A | 10/2015 |
| KR | 10-2017-0075345 A | 7/2017 |

* cited by examiner

*Primary Examiner* — Changhyun Yi
(74) *Attorney, Agent, or Firm* — Birch, Stewart, Kolasch & Birch, LLP

(57) ABSTRACT

A light emitting display apparatus includes an overcoating layer on a substrate and including a base portion and a protrusion portion. The light emitting display apparatus further includes a first electrode disposed to cover the base portion and a side portion of the protrusion portion. The light emitting display apparatus further includes a bank layer on a part of the first electrode. The light emitting display apparatus further includes a light emitting layer on the first electrode and the bank layer. The light emitting display apparatus further includes a second electrode on the light emitting layer. The bank layer includes a first part on the protrusion portion, a second part surrounding the first part and including an inclined upper surface, and a light extraction pattern on the first part adjacent to the second part.

19 Claims, 18 Drawing Sheets

LIGHT EMITTING DISPLAY APPARATUS

CROSS-REFERENCE TO RELATED APPLICATIONS

This application claims the priority benefit of the Korean Patent Application No. 10-2019-0058188 filed on May 17, 2019, the entirety of which is hereby incorporated by reference into the present application.

BACKGROUND

Technical Field

The present disclosure relates to a light emitting display apparatus, and more particularly, to a light emitting display apparatus with an improved light extraction efficiency.

Discussion of the Related Art

Recently, as our society advances toward an information-oriented society, the field of a display apparatus for visually expressing an electrical information signal has rapidly advanced. Various display apparatuses, having excellent performance in terms of thinness, lightness, and low power consumption, are being developed correspondingly.

Among various display apparatus, a light emitting display apparatus is a self-emitting display apparatus in which a separate light source is not needed, which is different from a liquid crystal display apparatus. Therefore, the light emitting display apparatus can be manufactured to have lightness and thinness. Further, since the light emitting display apparatus is driven at a low voltage, it is advantageous not only in terms of power consumption, but also in terms of color implementation, a response speed, a viewing angle, and a contrast ratio (CR). Therefore, it is expected to be utilized in various fields.

SUMMARY

Light emitted from a light emitting layer of a general light emitting display apparatus passes through various components of the light emitting display apparatus to be released to the outside of the light emitting display apparatus. However, some of the light emitted from the light emitting layer is not extracted to the outside of the light emitting display apparatus but is trapped inside the light emitting display apparatus so that the light extraction efficiency of the general light emitting display apparatus can become a problem.

For example, there is a problem in that some of light emitted from the light emitting layer is trapped in the general light emitting display apparatus due to a total reflection loss, a waveguide loss, and a surface plasmon loss. Here, the total reflection loss refers to degradation of the light extraction efficiency due to light trapped in the light emitting display apparatus due to the total reflection at an interface between a substrate and air, among the light emitted from the light emitting layer. The waveguide loss refers to the degradation of the light extraction efficiency caused by light trapped therein due to the total reflection at the interface of components in the light emitting display apparatus. The surface plasmon loss refers that the light vibrates free electrons of the metal surface due to a phenomenon that light is absorbed onto a metal surface during a process of entering and propagating the light so that the light cannot be reflected or transmitted to reduce the light extraction efficiency.

To address the above and other limitations associated with the general light emitting display apparatuses, the inventors of the present disclosure invented a light emitting display apparatus with a new structure to improve the light extraction efficiency of the light emitting display apparatus by improving or enhancing the total reflection loss and the waveguide loss. For example, the inventors of the present disclosure formed an overcoating layer which had a base portion with a flat upper surface and a protrusion portion protruding on the base portion and disposed an anode having a reflective layer on the base portion and a side portion of the protrusion portion. Therefore, the reflective layer of the anode formed at the side portion of the protrusion portion can serve as a side mirror and some of light trapped in the light emitting display apparatus due to the total reflection is extracted to the front direction of the light emitting display apparatus. As a result, the light extraction efficiency of the light emitting display apparatus is improved.

On the other hand, the inventors of the present disclosure have recognized a limitation in that even though the light emitting display apparatus as described above is used, there is still light lost due to the waveguide loss.

For example, some of the light emitted from the light emitting layer is totally reflected from an area formed by a light emitting layer, a cathode, and an inorganic encapsulation layer disposed between a bank layer and a foreign material cover layer to be trapped. Generally, a refractive index of a material that configures the bank layer is approximately 1.6, a refractive index of an organic material that configures the light emitting layer is approximately 1.8 to 1.9, a refractive index of an inorganic material that configures an inorganic encapsulation layer is approximately 1.8, and a refractive index of an organic material that configures the foreign material cover layer is approximately 1.5 to 1.6. Further, a refractive index of a metal material that configures a cathode is approximately 0.13. However, in a top emission type light emitting display apparatus, the cathode is formed to have a very thin thickness so that the cathode is substantially almost transparent. Therefore, the refractive index of the cathode may not significantly affect the total reflection. Thus, the cathode can be ignored and the light emitting layer and the inorganic encapsulation layer have similar refractive indexes so that the total reflection can be performed at the interface of the light emitting layer and the bank layer and the interface of the inorganic encapsulation layer and the foreign material cover layer.

Further, there is light that is emitted to the outside in an area where the bank layer is formed to be flat, among light trapped due to the total reflection at the interface between the light emitting layer and the bank layer and the interface between the inorganic encapsulation layer and the foreign material cover layer. However, the light is totally reflected into the light emitting display apparatus at the interface between the light emitting display apparatus and air to be trapped in the light emitting display apparatus.

Accordingly, the inventors of the present disclosure further invented a light emitting display apparatus with a new structure that is capable of improving or enhancing a light extraction efficiency of light that is lost due to the waveguide loss, as well as the total reflection loss.

An aspect of the present disclosure is to provide a light emitting display apparatus that is capable of improving or enhancing the light extraction efficiency using a side mirror type anode.

Another aspect of the present disclosure is to provide a light emitting display apparatus that is capable of minimizing light lost due to the waveguide loss that can be caused in spite of the usage of a side mirror type anode.

Another aspect of the present disclosure is to provide a light emitting display apparatus that improves the power consumption by improving or enhancing the light extraction efficiency.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an aspect of the present disclosure, there is provided a light emitting display apparatus. The light emitting display apparatus includes a substrate. The light emitting display apparatus further includes an overcoating layer on the substrate and including a base portion and a protrusion portion. The light emitting display apparatus further includes a first electrode disposed to cover the base portion and a side portion of the protrusion portion. The light emitting display apparatus further includes a bank layer on a part of the first electrode. The light emitting display apparatus further includes a light emitting layer on the first electrode and the bank layer. The light emitting display apparatus further includes a second electrode on the light emitting layer. The bank layer includes: a first part on the protrusion portion; a second part surrounding the first part and including an inclined upper surface; and a light extraction pattern on the first part adjacent to the second part.

According to another aspect of the present disclosure, there is provided a light emitting display apparatus. The light emitting display apparatus includes a substrate. The light emitting display apparatus further includes an overcoating layer on the substrate and including a base portion and a protrusion portion. The light emitting display apparatus further includes a light emitting diode on the overcoating layer and including a first electrode, a light emitting layer, and a second electrode. The light emitting display apparatus further includes a bank layer between the first electrode and the light emitting layer and defining an emission area. The light emitting display apparatus further includes an encapsulation part on the light emitting diode and including a first encapsulation layer, a foreign material cover layer, and a second encapsulation layer. An upper surface of the bank layer includes a concave pattern or a convex pattern on an inclined surface extending from the emission area, a flat surface spaced apart from the inclined surface, and the flat surface adjacent to the inclined surface to improve a light extraction efficiency and a front efficiency for light emitted from the light emitting diode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, the light extraction efficiency of the light emitting display apparatus can be improved using a side mirror type anode.

According to an embodiment of the present disclosure, the light lost due to the waveguide loss among the light emitted from the light emitting layer is reduced to enhance the light extraction efficiency.

An embodiment of the present disclosure can implement a light emitting display apparatus with improved power consumption by improving the light extraction efficiency.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
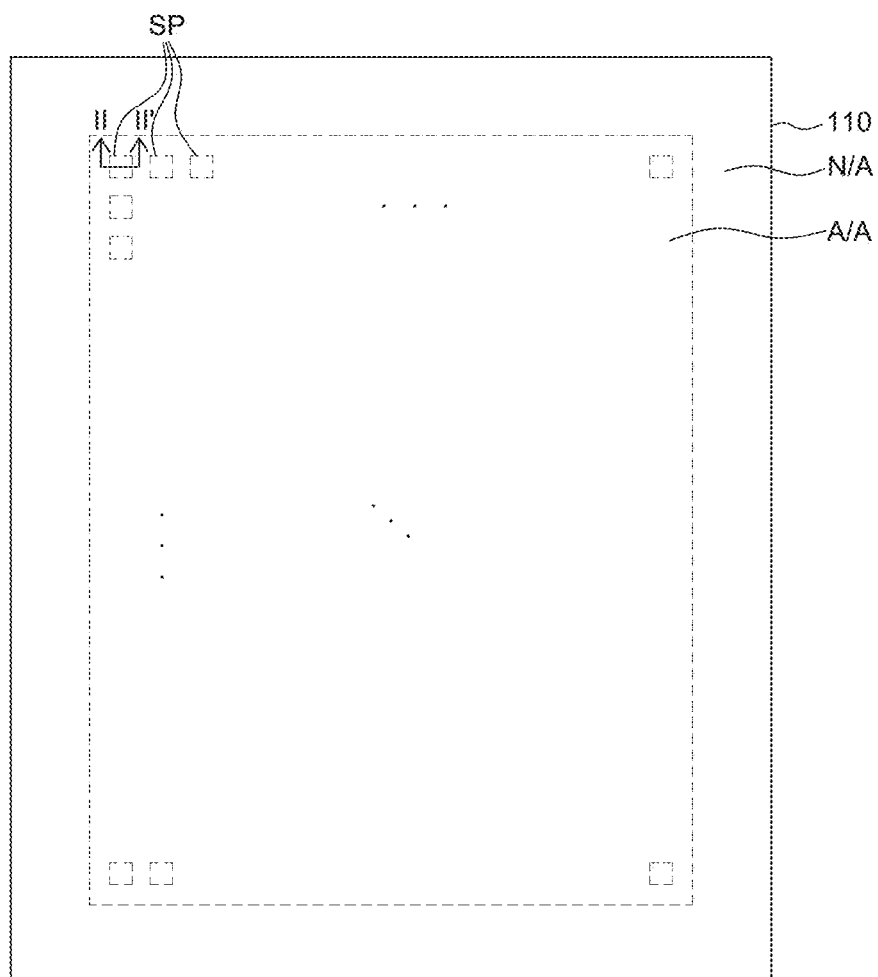
FIG. 1 illustrates a plan view of a light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer (or multiple layers) or another element (or multiple elements) can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings.

Figure 2:
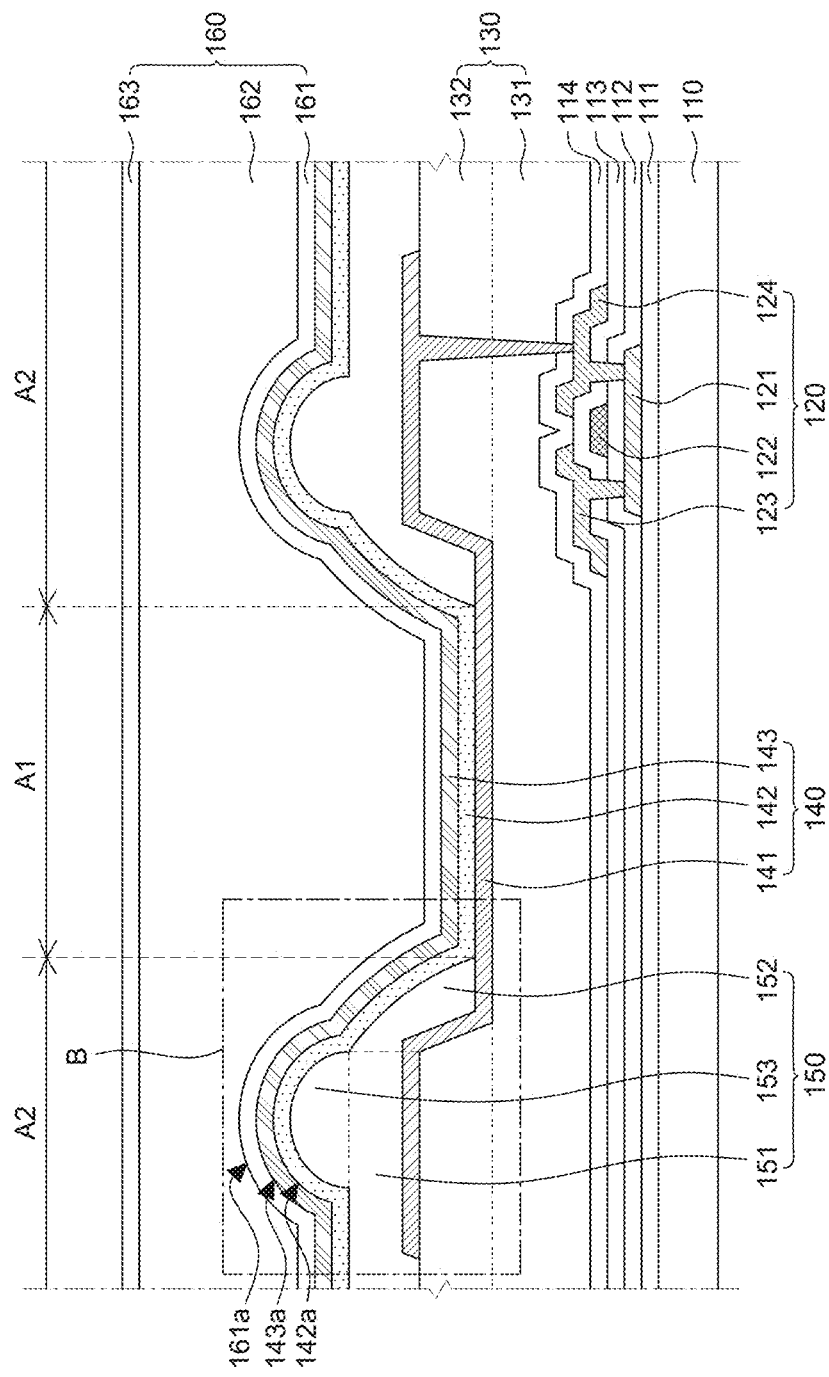
FIG. 2 is a cross-sectional view of the light emitting display apparatus taken along line II-II' of FIG. 1.

FIG. 1 illustrates a plan view of a light emitting display apparatus according to an exemplary embodiment of the present disclosure. FIG. 2 is a cross-sectional view of a light emitting display apparatus taken along the line II-II' of FIG. 1. All components of the light emitting display apparatus according to all embodiments of the present disclosure are operatively coupled and configured.

With reference to FIGS. 1 and 2, a light emitting display apparatus 100 includes a substrate 110, a thin film transistor 120, an overcoating layer 130, a light emitting diode 140, and a bank layer 150. The light emitting display apparatus 100 is implemented as a top emission type light emitting display apparatus.

The substrate 110 supports and protects several components of the light emitting display apparatus 100. The substrate 110 can be formed of a glass or a plastic material having flexibility. When the substrate 110 is formed of a plastic material, for example, the substrate can be formed of polyimide (PI), but it is not limited thereto.

The substrate 110 includes a display area A/A and a non-display area N/A.

The display area A/A is an area in which an image is displayed in the light emitting display apparatus 100 and a display element and various driving elements for driving the display element are disposed in the display area A/A. For example, the display element can be configured by a light emitting diode 140 including a first electrode 141, a light emitting layer 142, and a second electrode 143. Further, various driving elements for driving the display element, such as a thin film transistor 120, a capacitor, or a wiring line, can be disposed in the display area A/A.

A plurality of sub pixels SP can be included in the display area A/A. The sub pixel SP is a minimum unit that configures a screen and each of the plurality of sub pixels SP can include a light emitting diode 140 and a driving circuit. The plurality of sub pixels SP can emit light having different wavelengths. For example, the plurality of sub pixels SP can include a red sub pixel, a green sub pixel, and a blue sub pixel. But it is not limited thereto, and the plurality of sub pixels SP can further include a white sub pixel.

A driving circuit of each sub pixel SP is a circuit for controlling the driving of the light emitting diode 140. For example, the driving circuit can be configured to include the thin film transistor 120 and the capacitor, but is not limited thereto.

The non-display area N/A is an area where no image is displayed and various components for driving the plurality of sub pixels SP disposed in the display area A/A can be disposed in the non-display area N/A. For example, a driving IC that supplies a signal for driving the plurality of sub pixels SP and a flexible film can be disposed.

The non-display area N/A can be an area surrounding the display area A/A as illustrated in FIG. 1, but is not limited thereto. For example, the non-display area N/A can be an area extending from the display area A/A.

Hereinafter, one sub pixel SP among the plurality of sub pixels SP disposed in the display area A/A of the light emitting display apparatus 100 will be described in more detail with reference to FIG. 2.

Referring to FIG. 2, a buffer layer 111 is disposed on the substrate 110. The buffer layer 111 can serve to improve adhesiveness between layers formed on the buffer layer 111 and the substrate 110 and block alkali components leaked from the substrate 110. The buffer layer 111 can be formed as a single layer of silicon nitride (SiNx) or silicon oxide (SiOx), or a multilayer of silicon nitride (SiNx) and silicon oxide (SiOx), but is not limited thereto. The buffer layer 111 can be omitted based on a type or a material of the substrate 110 and a structure and a type of a thin film transistor 120.

The thin film transistor 120 is disposed on the buffer layer 111. The thin film transistor 120 can be used as a driving element that drives the light emitting diode 140 of the display area A/A. The thin film transistor 120 includes an active layer 121, a gate electrode 122, a source electrode 123, and a drain electrode 124. The thin film transistor 120 illustrated in FIG. 2 is a driving transistor and is a top gate type thin film transistor in which the gate electrode 122 is disposed on the active layer 121. However, it is not limited thereto, and the thin film transistor 120 can be implemented as a bottom gate type thin film transistor.

The active layer 121 is disposed on the buffer layer 111. When the thin film transistor 120 is driven, a channel is formed in the active layer 121. The active layer 121 can be formed of an oxide semiconductor or amorphous silicon (a-Si), polycrystalline silicon (poly-Si), or an organic semiconductor, etc.

A gate insulating layer 112 is disposed on the active layer 121. The gate insulating layer 112 is a layer for electrically insulating the gate electrode 122 from the active layer 121, and can be formed of an insulating material. For example, the gate insulating layer 112 can be formed as a single layer of silicon nitride (SiNx) or silicon oxide (SiOx) that is an inorganic material, or a multilayer of silicon nitride (SiNx) or silicon oxide (SiOx), but it is not limited thereto.

In the gate insulating layer 112, a contact hole through that the source electrode 123 and the drain electrode 124 are in contact with a source area and a drain area of the active layer 121 is formed. The gate insulating layer 112 can be formed on the entire surface of the substrate 110 as illustrated in FIG. 2 or be patterned to have the same width as the gate electrode 122, but is not limited thereto.

The gate electrode 122 is disposed on the gate insulating layer 112. The gate electrode 122 is disposed on the gate insulating layer 112 so as to overlap a channel area of the active layer 121. The gate electrode 122 can be one of various metal materials, for example, one of molybdenum (Mo), aluminum (Al), chrome (Cr), gold (Au), titanium (Ti), nickel (Ni), neodymium (Nd), and copper (Cu) or an alloy of two or more of them, or a multilayer thereof, but it is not limited thereto.

The interlayer insulating layer 113 is disposed on the gate electrode 122. For example, the interlayer insulating layer 113 can be formed as a single layer of silicon nitride (SiNx) or silicon oxide (SiOx) that is an inorganic material, or a multilayer of silicon nitride (SiNx) or silicon oxide (SiOx), but it is not limited thereto. In the interlayer insulating layer 113, a contact hole through that the source electrode 123 and the drain electrode 124 are in contact with the source area and the drain area of the active layer 121, respectively, is formed.

The source electrode 123 and the drain electrode 124 are disposed on the interlayer insulating layer 113. The source electrode 123 and the drain electrode 124 are disposed on the same layer to be spaced apart from each other. The source electrode 123 and the drain electrode 124 are electrically connected to the active layer 121 through the contact holes in the gate insulating layer 112 and the interlayer insulating layer 113. The source electrode 123 and the drain electrode 124 can be one of various metal materials, for example, one of molybdenum (Mo), aluminum (Al), chrome (Cr), gold (Au), titanium (Ti), nickel (Ni), neodymium (Nd), and copper (Cu) or an alloy of two or more of them, or a multilayer thereof, but it is not limited thereto.

In FIG. 2, only a driving transistor among various thin film transistors 120 in the light emitting display apparatus 100 is illustrated, but other transistors such as a switching transistor can also be disposed.

A passivation layer 114 for protecting the thin film transistor 120 is disposed on the thin film transistor 120. A contact hole that exposes the drain electrode 124 of the thin film transistor 120 is formed on the passivation layer 114. Even though in FIG. 2, it is illustrated that a contact hole that exposes the drain electrode 124 is formed on the passivation layer 114, it is not limited thereto. For example, a contact hole that exposes the source electrode 123 can be formed on the passivation layer 114. The passivation layer 114 can be formed as a single layer of silicon nitride (SiNx) or silicon oxide (SiOx), or a multilayer of silicon nitride (SiNx) or silicon oxide (SiOx), but it is not limited thereto. However, the passivation layer 114 can be omitted depending on an exemplary embodiment of the present disclosure.

An overcoating layer 130 is disposed on the passivation layer 114. The overcoating layer 130 is an insulating layer that protects the thin film transistor 120 and planarizes an upper portion of the thin film transistor 120. A contact hole that exposes the drain electrode 124 of the thin film transistor 120 is formed on the overcoating layer 130. Even though in FIG. 2, it is illustrated that a contact hole that exposes the drain electrode 124 is formed on the overcoating layer 130, it is not limited thereto. For example, a contact hole that exposes the source electrode 123 can be formed on the overcoating layer 130.

The overcoating layer 130 can be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but is not limited thereto.

The overcoating layer 130 includes a base portion 131 and a protrusion portion 132. As illustrated in FIG. 2, the base portion 131 and the protrusion portion 132 can be integrally formed. For example, the base portion 131 and the protrusion portion 132 are formed of the same material to be simultaneously formed by the same process, for example, by a mask process, but are not limited thereto.

The base portion 131 is disposed on the thin film transistor 120. An upper surface of the base portion 131 has a surface parallel to the substrate 110. Therefore, a step generated due to components disposed therebelow can be planarized by the base portion 131.

The protrusion portion 132 is disposed on the base portion 131. The protrusion portion 132 is integrally formed with the base portion 131 to protrude from the base portion 131. Therefore, an upper surface of the protrusion portion 132 can be smaller than a lower surface, but is not limited thereto.

The protrusion portion 132 has an upper surface and a side surface. The upper surface of the protrusion portion 132 is a surface disposed on an uppermost portion of the protrusion portion 132 and can be a surface substantially parallel to the base portion 131 or the substrate 110. The side surface of the protrusion portion 132 can be a surface that connects the upper surface of the protrusion portion 132 and the base portion 131. The side surface of the protrusion portion 132 can be inclined shape toward the base portion 131.

In FIG. 2, it is illustrated that the overcoating layer 130 includes the base portion 131 having a flat or plane upper surface and the protrusion portion 132 protruding from the base portion 131. However, as long as the overcoating layer 130 is implemented by the base portion 131 and the protrusion portion 132, a detailed configuration of the overcoating layer 130 is not defined to the base portion 131 and the protrusion portion 132, but can be defined in various ways.

The light emitting diode 140 is disposed on the overcoating layer 130. The light emitting diode 140 includes a first electrode 141 that is electrically connected to the drain electrode 124 of the thin film transistor 120, a light emitting layer 142 on the first electrode 141, and a second electrode 143 formed on the light emitting layer 142.

The first electrode 141 is disposed on the overcoating layer 130 to cover the base portion 131 and the protrusion portion 132. For example, the first electrode 141 is disposed at partial area among upper surface of the base portion 131 where the protrusion portion 132 is not disposed, the side surface of the protrusion portion 132, and the upper surface of the protrusion portion 132 and are disposed in accordance with the shape of the base portion 131 and the protrusion portion 132. However, it is not limited thereto, and the first electrode 141 can be disposed only on the upper surface of the base portion 131 where the protrusion portion 132 is not disposed, and the side surface of the protrusion portion 132.

The first electrode 141 is electrically connected to the drain electrode 124 through the contact hole that is formed on the passivation layer 114 and the overcoating layer 130. The first electrode 141 can be an anode of the light emitting diode 140. The first electrode 141 can be electrically connected to the drain electrode 124 of the thin film transistor 120 through the contact hole, but is not limited thereto. For example, the first electrode 141 can be configured to be electrically connected to the source electrode 123 of the thin film transistor 120 through the contact hole based on a type of the thin film transistor 120 and a design method of a driving circuit.

Even though in FIG. 2, the first electrode 141 is illustrated as a single layer, the first electrode 141 can be configured as a multilayer. For example, the first electrode 141 can include a reflective layer that reflects light emitted from the light emitting layer 142 toward the second electrode 143 and a transparent conductive layer that supplies holes to the light emitting layer 142.

The reflective layer is disposed on the overcoating layer 130 to reflect light emitted from the light emitting diode 140 upwardly. The light generated in the light emitting layer 142 of the light emitting diode 140 can be emitted not only upwardly, but also laterally. The light that is laterally emitted is directed to the inside of the light emitting display apparatus 100 or trapped in the light emitting display apparatus 100 due to the total reflection, or further travels to a direction of the inner portion of the light emitting display apparatus 100 and then disappears. Therefore, the reflective layer is disposed below the light emitting layer 142 to cover a side portion of the protrusion portion 132 of the overcoating layer 130 to change a traveling direction of the light that is directed to a side portion of the light emitting layer 142 to a front direction.

The reflective layer can be formed of a metal material, for example, aluminum (Al), silver (Ag), copper (Cu), and a magnesium-silver alloy (Mg:Ag), but is not limited thereto.

The transparent conductive layer is disposed on the reflective layer. The transparent conductive layer can be formed of a conductive material having a high work function to supply holes to the light emitting layer 142. For example, the transparent conductive layer can be formed of transparent conductive oxide such as indium tin oxide (ITO), indium zinc oxide (IZO), indium tin zinc oxide (ITZO), zinc oxide (ZnO), and tin oxide (TO), but is not limited thereto.

The bank layer 150 is disposed on the overcoating layer 130 and the first electrode 141. The bank layer 150 can cover a part or some portion of the first electrode 141 of the light emitting diode 140 to define an emission area A1 and a non-emission area A2. For example, the bank layer 150 is not disposed in the emission area A1, so that the light emitting layer 142 is disposed immediately on the first electrode 141 to generate the light from the light emitting layer 142. In the non-emission area A2, the bank layer 150 is disposed between the first electrode 141 and the light emitting layer 142 to block the generation of the light.

The bank layer 150 can be formed of an organic material. For example, the bank layer 150 can be formed of an organic material such as polyimide, acrylic or benzocyclobutene resin, but is not limited thereto. When the bank layer 150 is configured by the organic material, a refractive index can be approximately 1.6. Even though in FIG. 2, the bank layer 150 is illustrated to be formed of an organic material, the bank layer 150 is not necessarily formed of the organic material, but can be formed of an inorganic material.

The bank layer 150 includes a first part 151 disposed on the protrusion portion 132, a second part 152 directed to the base portion 131 from the first part 151, and a light extraction pattern 153 protruding from the first part 151.

The first part 151 is disposed to cover the protrusion portion 132 and the first electrode 141 on the protrusion portion 132. The first part 151 can planarize an upper portion of the protrusion portion 132 of the overcoating layer 130. Therefore, the first part 151 can have a flat or plane upper surface. For example, the upper surface of the first part 151 can be parallel to the upper surface of the protrusion portion 132.

The second part 152 is disposed to be directed to the base portion 131 from the first part 151. The second part 152 surrounds the first part 151, and has an inclined upper surface along a step between the upper surface of the base portion 131 and the upper surface of the protrusion portion 132. The second part 152 can expose a part or some portion of the first electrode 141 and define the emission area A1.

The light extraction pattern 153 controls a path of light that is trapped between the bank layer 150 and the foreign material cover layer 162 due to the total reflection to increase an amount of extracted light. The light extraction pattern 153 is disposed at a border or boundary of the first part 151 and the second part 152, and for example, can be disposed at an edge or end portion of the first part 151 that is adjacent to the second part 152. The light extraction pattern 153 can be disposed on the protrusion portion 132 of the overcoating layer 130 and the first electrode 141. The light extraction pattern 153 of the bank layer 150 and a first protrusion pattern 142a of the light emitting layer 142, a second protrusion pattern 143a of the second electrode 143, and a third protrusion pattern 161a of the first encapsulation layer 161 corresponding thereto will be described below with reference to FIGS. 3 to 4B.

In FIG. 2, it is illustrated that the bank layer 150 includes the first part 151, the second part 152, and the light extraction pattern 153. However, as long as the bank layer 150 is implemented by the first part 151, the second part 152, and the light extraction pattern 153, the detailed configuration of the bank layer 150 is not limited to the first part 151, the second part 152, and the light extraction pattern 153, but can be defined in various ways.

Further, even though in FIG. 2, it is illustrated that the first part 151, the second part 152 and the light extraction pattern 153 are integrally formed, it is not limited thereto, and at least one of the first part 151, the second part 152, and the light extraction pattern 153 can be formed to be separated from the others.

The light emitting layer 142 is disposed on the first electrode 141. For example, the light emitting layer 142 is disposed on the first electrode 141 in the emission area A1 and is disposed on the bank layer 150 in the non-emission area A2. The light emitting layer 142 can be disposed in accordance with the shapes of the first electrode 141 and the bank layer 150. Further, the light emitting layer 142 includes the first protrusion pattern 142a corresponding to the light extraction pattern 153 of the bank layer 150.

The light emitting layer 142 is a layer for emitting light having a specific color, and includes one or more of a red light emitting layer, a green light emitting layer, a blue light emitting layer, and a white light emitting layer. Further, the light emitting layer 142 can further include various layers such as a hole transport layer, a hole injection layer, a hole blocking layer, an electron injection layer, an electron blocking layer, or an electron transport layer. A refractive index of the light emitting layer 142 can vary based on a type of an organic material which configures the light emitting layer 142, but an average refractive index of an organic material used for the light emitting layer 142 can be approximately 1.8 to 1.9. The light emitting layer 142 can be an organic light emitting layer formed of an organic material, but is not limited thereto. For example, the light emitting layer 142 can be a quantum dot light emitting layer or a micro LED.

The second electrode 143 is disposed on the light emitting layer 142. For example, the second electrode 143 can be disposed on the light emitting layer 142 in accordance with the shape of the light emitting layer 142. The second electrode 143 includes the second protrusion pattern 143a corresponding to the first protrusion pattern 142a of the light emitting layer 142. The second electrode 143 supplies electrons to the light emitting layer 142. The second electrode 143 can be a cathode of the light emitting diode 140.

The second electrode 143 can be formed of a transparent conductive oxide such as indium tin oxide (ITO), indium zinc oxide (IZO), indium tin zinc oxide (ITZO), zinc oxide (ZnO), and tin oxide (TO) or an ytterbium (Yb) alloy. When the second electrode 143 is formed of a transparent conductive oxide such as indium tin oxide (ITO), a refractive index of the second electrode 143 can be approximately 1.8 to 1.9. Further, the second electrode 143 can be formed of a metal material such as silver (Ag), copper (Cu), or a magnesium-silver alloy (Mg:Ag) or a metal material having a very thin thickness, but it is not limited thereto. When the second electrode 143 is formed of a metal material, a refractive index thereof is very low. For example, when silver (Ag) is used for the second electrode 143, the refractive index of the second electrode 143 can be approximately 0.13. However, since the light emitting display apparatus 100 is a top emission type, the second electrode 143 has a very thin thickness so that the refractive index of the second electrode 143 may not affect the traveling of the light.

An encapsulation part 160 can be formed on the light emitting diode 140 to protect the light emitting diode 140 that is vulnerable to moisture so as not to be exposed to the moisture. The encapsulation part 160 can block the oxygen and moisture that penetrate into the light emitting display apparatus 100 from the outside. For example, when the light emitting display apparatus 100 is exposed to the moisture or oxygen, a pixel shrink phenomenon that the emission area is shrunk occurs or a dead pixel in the emission area is generated. Therefore, the encapsulation part 160 blocks the oxygen and moisture to protect the light emitting display apparatus 100. For example, the encapsulation part 160 can have a structure in which inorganic layers and organic layers are alternately laminated, but is not limited thereto.

With reference to FIG. 2, the encapsulation part 160 includes a first encapsulation layer 161, a foreign material cover layer 162, and a second encapsulation layer 163.

The first encapsulation layer 161 is disposed on the second electrode 143 to suppress or reduce the permeation of the moisture or oxygen. The first encapsulation layer 161 can be formed of an inorganic material such as silicon nitride (SiNx), silicon oxynitride (SiNxOy), or aluminum oxide (AlyOz), but is not limited thereto. The first encapsulation layer 161 can be formed of a material having a refractive index larger than that of the foreign material cover layer 162. For example, the first encapsulation layer 161 is formed of silicon nitride (SiNx) or silicon oxynitride (SiNxOy), the refractive index of the first encapsulation layer 161 can be approximately 1.8. The first encapsulation layer 161 can include a third protrusion pattern 161a on the second protrusion pattern 143a of the second electrode 143.

The foreign material cover layer 162 is disposed on the first encapsulation layer 161 to planarize the surface. Further, the foreign material cover layer 162 can cover foreign materials or particles which can be generated during a manufacturing process. The foreign material cover layer 162 can be formed of an organic material, such as silicon oxy carbon (SiOxCz), acryl or epoxy resin, but is not limited thereto. The foreign material cover layer 162 can be formed of a material having a refractive index smaller than that of the first encapsulation layer 161. For example, when the foreign material cover layer 162 is an acrylic resin, the refractive index of the foreign material cover layer 162 can be approximately 1.5 to 1.6.

The second encapsulation layer 163 is disposed on the foreign material cover layer 162 and suppresses the permeation of the moisture or oxygen together with the first encapsulation layer 161. The second encapsulation layer 163 can be formed of an inorganic material such as silicon nitride (SiNx), silicon oxynitride (SiNxOy), silicon oxide (SiOx), or aluminum oxide (AlyOz), but is not limited thereto. The second encapsulation layer 163 can be formed of the same material as the first encapsulation layer 161 or formed of different materials.

Hereinafter, the light extraction through the light extraction pattern 153 of the bank layer 150 will be described in more detail with reference to FIG. 3 together.

Figure 3:
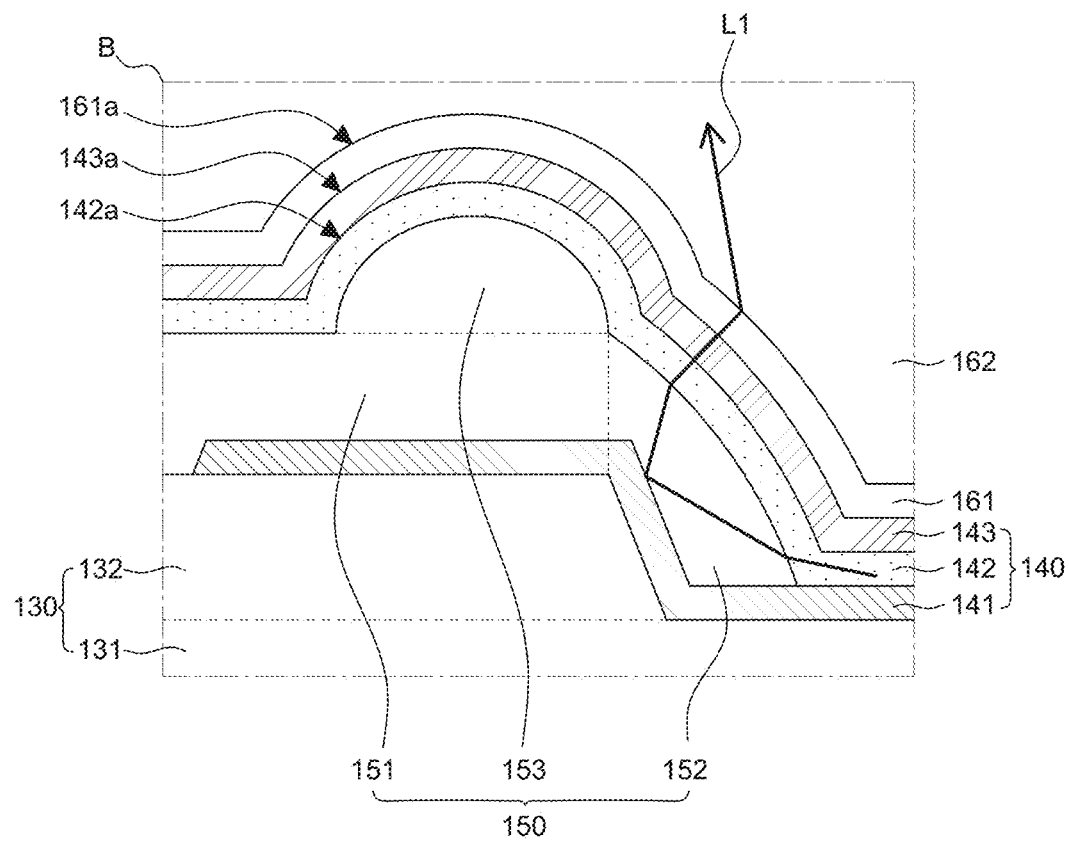
FIG. 3 is an enlarged view of a part B of FIG. 2.

FIG. 3 is an enlarged view of a part B of FIG. 2.

With reference to FIG. 3, the first electrode 141, the bank layer 150, the light emitting layer 142, the second electrode 143, the first encapsulation layer 161, and the foreign material cover layer 162 are disposed on the overcoating layer 130.

The bank layer 150 exposes a part or some portion of the first electrode 141 disposed on the base portion 131 and is disposed on the first electrode 141 and the protrusion portion 132. The bank layer 150 includes the first part 151, the second part 152, and the light extraction pattern 153.

The light extraction pattern 153 protrudes from the first part 151. The light extraction pattern 153 controls the path of the light emitted from the light emitting layer 142 to increase an amount of light extracted to the outside. Even though in FIG. 3, it is illustrated that the light extraction pattern 153 has a convex semicircular shape, it is not limited thereto. For example, as it will be described in the following exemplary embodiments, the light extraction pattern can have various protruding shapes such as a convex pattern with a concave side surface, a triangle, or a trapezoid, etc.

The light extraction pattern 153 is disposed at a border or boundary of the first part 151 and the second part 152. An edge or end portion of the light extraction pattern 153 can correspond to a point where the first part 151 and the second part 152 are connected. For example, the edge or end portion of the light extraction pattern 153 can correspond to an edge or end portion of an inclined surface of the second part 152 that is connected to the first part 151, but it is not limited thereto. The edge or end portion of the light extraction pattern 153 can be spaced apart from the edge or end portion of the inclined surface with a predetermined distance therebetween.

A gradient of a tangent line of a part of the light extraction pattern 153 that is adjacent to the second part 152 can be larger than a gradient of a tangent line of a part of the second part 152 that is adjacent to the light extraction pattern 153. For example, a slope of the part of the light extraction pattern 153 that is adjacent to the second part 152 can be steeper than a slope of the second part 152 that is adjacent to the light extraction pattern 153. Accordingly, slopes of the light extraction pattern 153 and the second part 152 are implemented, and thus, the traveling path of the light is changed to improve the light extraction efficiency.

The light extraction pattern 153 can be disposed to surround the emission area A1 at a flat or plane surface. For example, the light extraction pattern 153 is disposed at the border or boundary of the first part 151 and the second part 152 to surround the emission area A1, and has a closed loop shape, but it is not limited thereto. The light extraction pattern 153 is configured by a plurality of patterns and forms a closed loop shape surrounding the emission area A1.

The light emitting layer 142 is disposed on the first electrode 141 and the bank layer 150 in accordance with the shapes of the first electrode 141 and the bank layer 150. The light emitting layer 142 includes a first protrusion pattern 142a corresponding to the light extraction pattern 153. The second electrode 143 is disposed on the light emitting layer 142 in accordance with the shape of the light emitting layer 142. The second electrode 143 includes a second protrusion pattern 143a corresponding to the light extraction pattern 153. The first encapsulation layer 161 is disposed on the second electrode 143 in accordance with the shape of the second electrode 143. The first encapsulation layer 161 includes a third protrusion pattern 161a corresponding to the light extraction pattern 153. The foreign material cover layer 162 is disposed on the first encapsulation layer 161 to planarize an upper portion of the light emitting diode 140.

The light extraction pattern 153 and the protrusion patterns 142a, 143a, and 161a are disposed to overlap the first electrode 141 on the protrusion portion 132. Therefore, the light path is changed by the light extraction pattern 153 and the protrusion patterns 142a, 143a, and 161a, light incident onto the first electrode 141 is reflected by the reflective layer of the first electrode 141 and is extracted to the outside of the light emitting display apparatus 100.

Because the light emitting display apparatus 100 according to the exemplary embodiment of the present disclosure is a top emission type light emitting display apparatus, the light emitting display apparatus 100 can be manufactured so as to implement micro cavity. For example, in the light emitting display apparatus 100 according to the exemplary embodiment of the present disclosure, a distance between the reflective layer of the first electrode 141 and the second electrode 143 is adjusted, and thus, a constructive interference for light emitted from the light emitting layer 142 is implemented and enhance the optical efficiency.

In contrast, in a light emitting display apparatus of the related art, among the light emitted from the light emitting layer, light trapped in the display apparatus to be lost causes the degradation of the light efficiency. For example, some of the light emitted from the light emitting layer is not extracted to the outside of the light emitting display apparatus due to the total reflection loss or the waveguide loss, so that the light extraction efficiency of the light emitting display apparatus according to the related art is reduced. For example, in the light emitting display apparatus of the related art, the first electrode that is formed on the overcoating layer has a flat upper surface so that among light emitted from the light emitting layer, light emitted with a low emission angle can be trapped in the light emitting display apparatus due to the total reflection loss or the waveguide loss.

Therefore, the light emitting display apparatus 100 according to the exemplary embodiment of the present disclosure uses the overcoating layer 130 having the protrusion portion 132 to improve the light extraction efficiency of the light emitting diode 140. For example, in the light emitting display apparatus 100 according to the exemplary embodiment of the present disclosure, the overcoating layer 130 includes the base portion 131 and the protrusion portion 132 protruding from the base portion 131. Further, the reflective layer of the first electrode 141 of the light emitting diode 140 is disposed to cover the base portion 131 and the side surface of the protrusion portion 132. Therefore, among the light emitted from the light emitting layer 142 of the light emitting display apparatus 100, light emitted with a small extraction angle is extracted to the front direction by the first electrode 141 disposed at a side portion of the protrusion portion 132. For example, when the first electrode is disposed on the overcoating layer having a flat or plane shape as in the light emitting display apparatus of the related art, light directed to the side direction, that is, light emitted with a low extraction angle does not travel to the front direction and may not be extracted to the outside of the light emitting display apparatus due to the total reflection loss or the waveguide loss. However, in the light emitting display apparatus 100 according to the exemplary embodiment of the present disclosure, first light L1 extracted from the light emitting layer 142 with a low extraction angle is reflected by the first electrode 141 disposed at the side portion of the protrusion portion 132 to be extracted to the front direction. Accordingly, in the light emitting display apparatus 100 according to the exemplary embodiment of the present disclosure, the first electrode 141 disposed at the side portion of the overcoating layer 130 serves as a side mirror to extract the light that can be lost in the light emitting display apparatus 100 to the front direction. Therefore, the light extraction efficiency is improved, and the power consumption is improved or enhanced.

Further, in the light emitting display apparatus 100 according to the exemplary embodiment of the present disclosure, the light extraction pattern 153 is formed on the bank layer 150 to further improve or enhance the light extraction efficiency. For example, some of light emitted from the light emitting layer 142 is totally reflected in an area formed by the light emitting layer 142, the second electrode 143, and the first encapsulation layer 161 between the bank layer 150 and the foreign material cover layer 162 and trapped therein. For example, a refractive index of a material that configures the bank layer 150 is approximately 1.6, a refractive index of an organic material that configures the light emitting layer 142 is approximately 1.8 to 1.9, and a refractive index of an inorganic material that configures the first encapsulation layer 161 is approximately 1.8. Further, a refractive index of an organic material that configures the foreign material cover layer 162 is approximately 1.5 to 1.6. Further, even though the second electrode 143 is formed of a transparent conductive material or a metal material, the second electrode 143 has a very thin thickness, and thus, it is almost transparent. Therefore, because the second electrode 143 can be ignored, the total reflection is generated at the interface of the light emitting layer 142 and the bank layer 150 and the interface of the first encapsulation layer 161 and the foreign material cover layer 162. Thus, there can be light trapped between the bank layer 150 and the foreign material cover layer 162.

Further, when the upper surface of the bank layer 150 is flat or plane shape, the light trapped between the bank layer and the foreign material cover layer 162 can be extracted to the outside in an area where the bank layer is flat. However, the light is again totally reflected into the light emitting display apparatus 100 at the interface between the light emitting display apparatus 100 and air, and trapped in the light emitting display apparatus 100.

Therefore, in the light emitting display apparatus 100 according to the exemplary embodiment of the present disclosure, the light extraction pattern 153 is disposed on the bank layer 150 to control a path of the light trapped between the bank layer 150 and the foreign material cover layer 162 due to the total reflection. For example, the light extraction pattern 153 that protrudes from the first part 151 with a convex semicircular shape is disposed on the bank layer 150. A first protrusion pattern 142a, a second protrusion pattern 143a, and a third protrusion pattern 161a corresponding to the light extraction pattern 153 are formed on the light emitting layer 142, the second electrode 143, and the first encapsulation layer 161 on the bank layer 150, respectively. Therefore, the light extraction pattern 153 and the protrusion patterns 142a, 143a, and 161a can control the path of the light and improve or enhance the light extraction efficiency. The improvement of the light extraction efficiency using the light extraction pattern 153 will be described in more detail with reference to FIGS. 4A and 4B together.

Figure 4A:
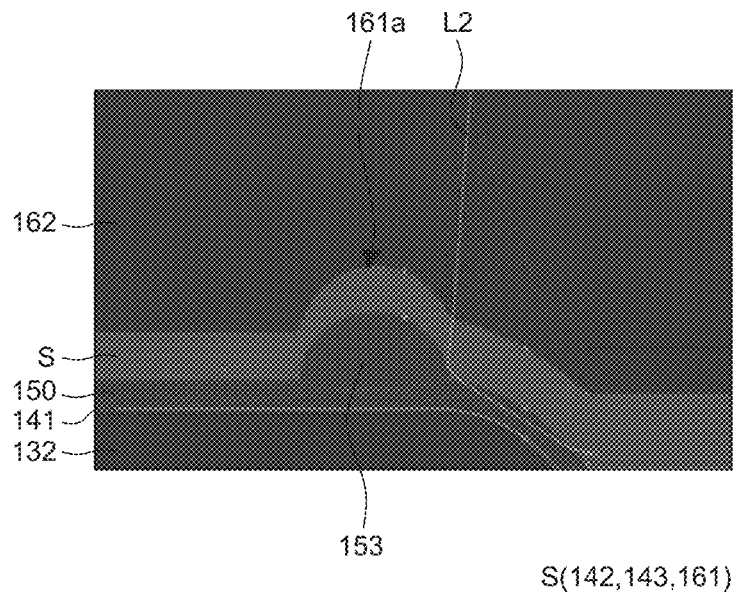
FIGS. 4A and 4B are examples of simulation results for describing a light extraction of a light emitting display apparatus according to an exemplary embodiment of the present disclosure.
Figure 4B:
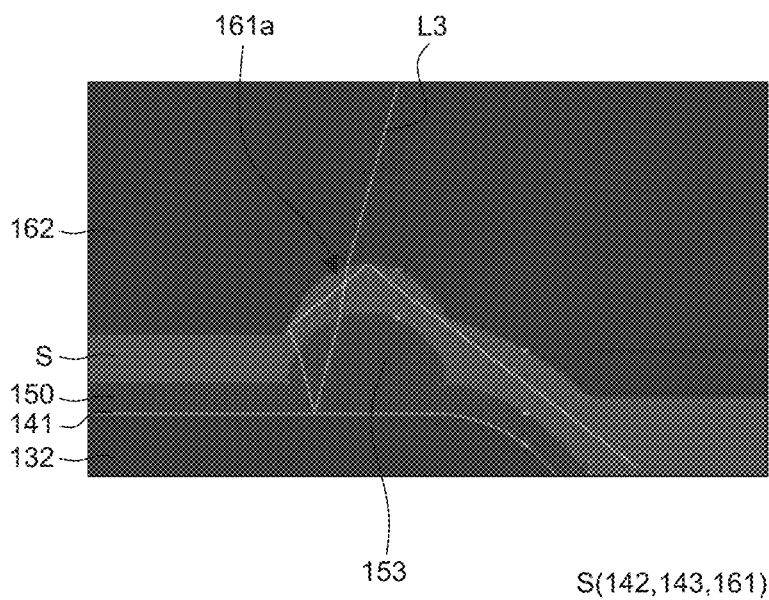

FIGS. 4A and 4B are examples of simulation results for describing a light extraction of a light emitting display apparatus according to an exemplary embodiment of the present disclosure. Particularly, FIGS. 4A and 4B are images obtained by simulating the light emitting display apparatus 100 according to the exemplary embodiment of the present disclosure using the Ray Optics simulation program and a refractive index of the bank layer 150 is set to 1.6 and a refractive index of the foreign material cover layer 162 is set to 1.5. Further, the light emitting layer 142, the second electrode 143, and the first encapsulation layer 161 are set as an area S and a refractive index of the area S is set to 1.8. In FIGS. 4A and 4B, for the convenience of description, only one light is illustrated to explain the simulation result.

With reference to FIGS. 4A and 4B, the paths of light L2 and L3 emitted from the light emitting layer 142 of the area S are controlled by the light extraction pattern 153 and the third protrusion pattern 161a so that the light L2 and L3 can be extracted to the outside of the light emitting display apparatus 100. For example, the light extraction pattern 153 of the bank layer 150 and the third protrusion pattern 161a of the first encapsulation layer 161 have an upwardly convex semicircular shape. Therefore, the path of the light is changed due to the reflection of light L2 and L3 at the interface between the light extraction pattern 153 and the third protrusion pattern 161a and the amount of light extracted to the front surface of the light emitting display apparatus 100 can be increased.

First, with reference to FIG. 4A, the second light L2 emitted from the light emitting layer 142 passes through the bank layer 150 and the area S and is totally reflected through the upper surface of the light extraction pattern 153. The second light L2 that is totally reflected passes through the area S and the foreign material cover layer 162 to be extracted to the outside of the light emitting display apparatus 100. For example, the second light L2 is totally reflected by the light extraction pattern 153 protruding from the first part 151 of the bank layer 150, the path of the light is changed to the front surface and the light is extracted to the front surface of the light emitting display apparatus 100.

Next, with reference to FIG. 4B, for example, the third light L3 emitted from the light emitting layer 142 is totally reflected two times by the third protruding pattern 161a in the area S and a traveling path can be changed. For example, the third light L3 is totally reflected two times at the interface between the area S disposed to be convex in accordance with the shape of the light extraction pattern 153 and the foreign material cover layer 162, passes through the bank layer 150, is reflected by the first electrode 141. Thereafter, the third light L3 passes through the bank layer 150, the area S, and the foreign material cover layer 162, and is extracted to the outside of the light emitting display apparatus 100. For example, a light path of the third light L3 is changed by the shape of the third protrusion pattern 161a, and the third light L3 is reflected by the first electrode 141 and travels with a small incident angle. Therefore, the third light L3 is extracted to the front surface of the light emitting display apparatus 100.

Therefore, in the light emitting display apparatus 100 according to the exemplary embodiment of the present disclosure, the light extraction efficiency can be improved by the light extraction pattern 153 of the bank layer 150. When the light extraction pattern 153 is omitted and the upper surface of the bank layer 150 has a flat or plane shape, the light L2 and L3 can be trapped in the area S due to the total reflection and lost due to the total reflection. However, in the light emitting display apparatus 100 according to the exemplary embodiment of the present disclosure, a reflective angle of the light that can be trapped between the foreign material cover layer 162 and the bank layer 150 is changed by the convex semicircular shape of the light extraction pattern 153 of the bank layer 150. Therefore, the light that is extracted to the front surface of the light emitting apparatus 100 can be increased. Accordingly, the light extraction efficiency of the light emitting display apparatus 100 can be improved and the power consumption can be improved.

Figure 5:
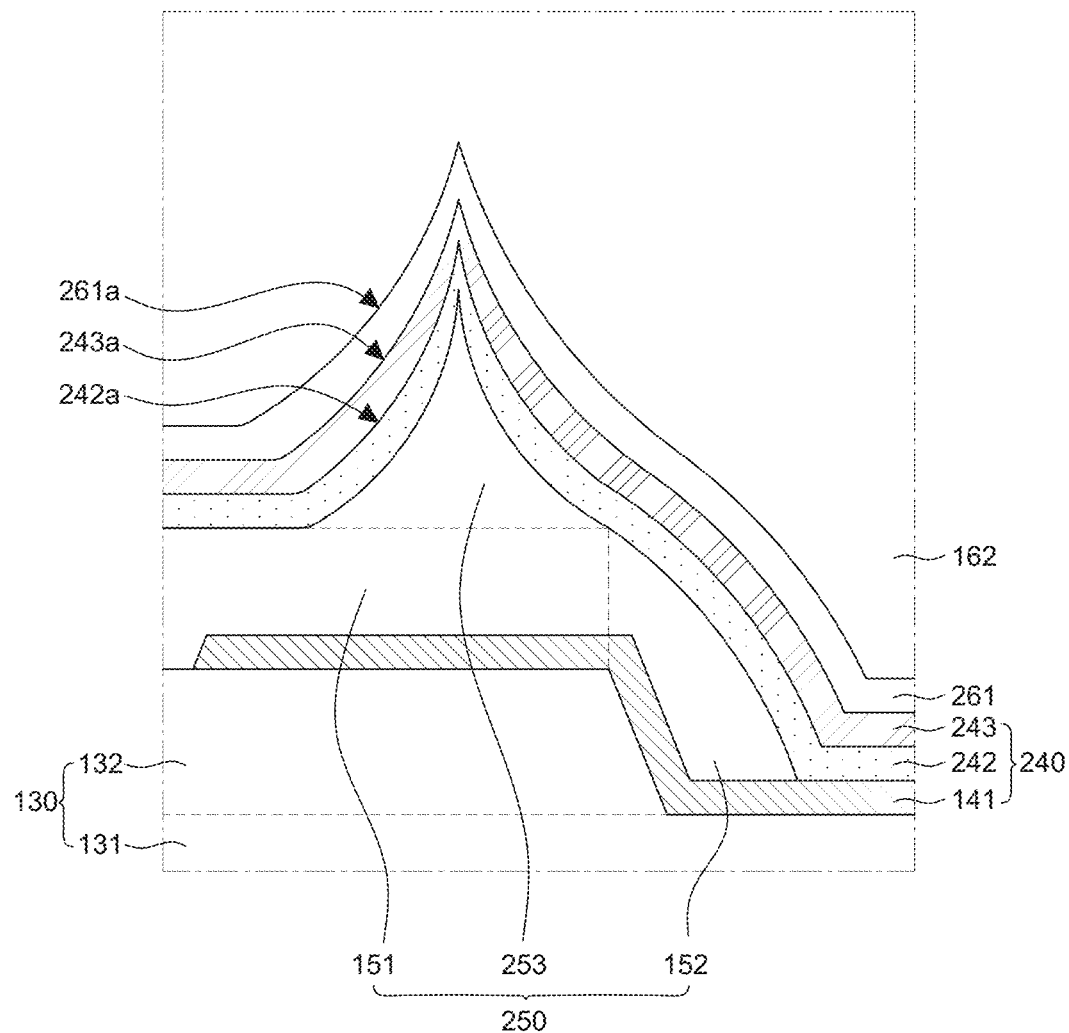
FIG. 5 is an enlarged view of a light emitting display apparatus according to another exemplary embodiment of the present disclosure.

FIG. 5 is an enlarged view of a light emitting display apparatus 200 according to another exemplary embodiment of the present disclosure. A bank layer 250, a light emitting diode 240, and a first encapsulation layer 261 of the light emitting display apparatus 200 of FIG. 5 are different from those of the light emitting display apparatus 100 of FIGS. 1 and 3, but other configurations are substantially the same so that a redundant description will be omitted or may be briefly provided. For example, the enlarged view in FIG. 5 is an enlarged view of a part of the light emitting display apparatus 200, which would be similar to the part B of FIG. 2.

With reference to FIG. 5, the bank layer 250 includes a first part 151, a second part 152, and a light extraction pattern 253. The light extraction pattern 253 of the bank layer 250 protrudes from the first part 151 to have a convex pattern. The light extraction pattern 253 includes a concave side surface. For example, surfaces between an apex of an uppermost edge or portion of the light extraction pattern 253 and the first part 151 and the second part 152 can be formed as concave curved surfaces.

The light emitting layer 242 includes a first protrusion pattern 242a corresponding to the light extraction pattern 253. The second electrode 243 includes a second protrusion pattern 243a corresponding to the light extraction pattern 253. The first encapsulation layer 261 includes a third protrusion pattern 261a corresponding to the light extraction pattern 253. For example, the light emitting layer 242, the second electrode 243, and the first encapsulation layer 261 are disposed in accordance with the shape of the light extraction pattern 253 disposed therebelow.

In the light emitting display apparatus 200 according to another exemplary embodiment of the present disclosure, the light extraction pattern 253 protruding with a concave side surface and the first protrusion pattern 242a, the second protrusion pattern 243a, and the third protrusion pattern 261a corresponding thereto are formed. Therefore, the light extraction pattern 253 and the protrusion patterns 242a, 243a, and 261a can control the path of the light and improve the light extraction efficiency. The improvement of the light extraction efficiency using the light extraction pattern 253 will be described in more detail with reference to FIG. 6 together.

Figure 6:
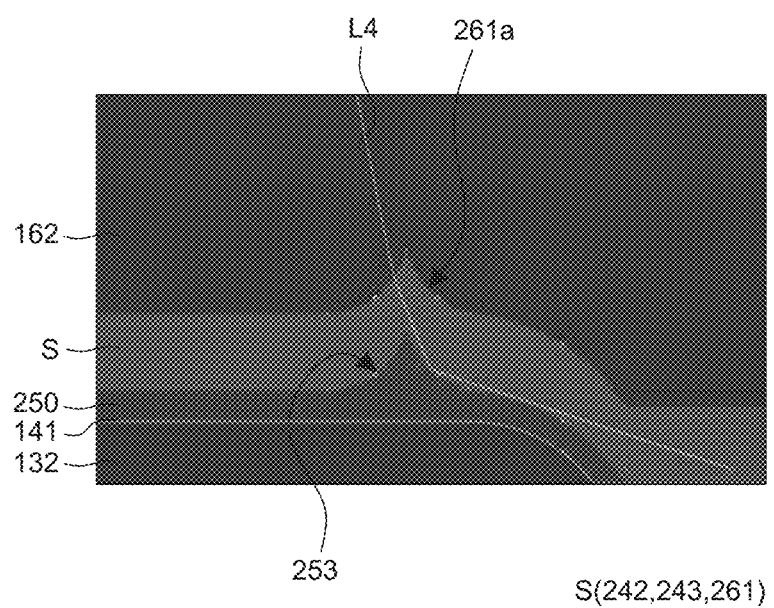
FIG. 6 is an example of a simulation result for describing a light extraction of a light emitting display apparatus according to another exemplary embodiment of the present disclosure.

FIG. 6 is an example of a simulation result for describing a light extraction of a light emitting display apparatus according to another exemplary embodiment of the present disclosure. FIG. 6 is an image obtained by simulating the light emitting display apparatus 200 according to another exemplary embodiment of the present disclosure using Ray Optics simulation program. For the convenience of description, only one light which can explain a simulation result is illustrated.

With reference to FIG. 6, the light path of the light L4 emitted from the light emitting layer 242 of the area S is controlled a path of light by the light extraction pattern 253 and the third protrusion pattern 261a, and the light L4 can be extracted to the outside of the light emitting display apparatus 200. For example, the light extraction pattern 253 of the bank layer 250 and the third protrusion pattern 261a of the first encapsulation layer 161 protrudes upwardly with a concave side surface. Therefore, the path of the light is changed due to the reflection of light L4 performed at the interface between the light extraction pattern 253 and the third protrusion pattern 261a and the amount of light extracted to the front surface of the light emitting display apparatus 200 can be increased.

With reference to FIG. 6, the fourth light L4 emitted from the light emitting layer 142 is totally reflected through the upper surface of the light extraction pattern 253. The fourth light L4 that is totally reflected passes through the foreign material cover layer 162, and extracted to the outside of the light emitting display apparatus 200. For example, a path of the fourth light L4 is changed to the front surface by the light extraction pattern 253 protruding from the first part 251 of the bank layer 250, and the light is extracted to the front surface of the light emitting display apparatus 200.

Therefore, in the light emitting display apparatus 200 according to another exemplary embodiment of the present disclosure, a reflective angle of the light that can be trapped between the foreign material cover layer 162 and the bank layer 250 due to the concave side surface of the light extraction pattern 253 of the bank layer 250 is changed. Therefore, the light that is extracted to the front surface of the light emitting apparatus 200 can be increased. Accordingly, the light extraction efficiency of the light emitting display apparatus 200 is improved and the power consumption can be improved.

Figure 7A:
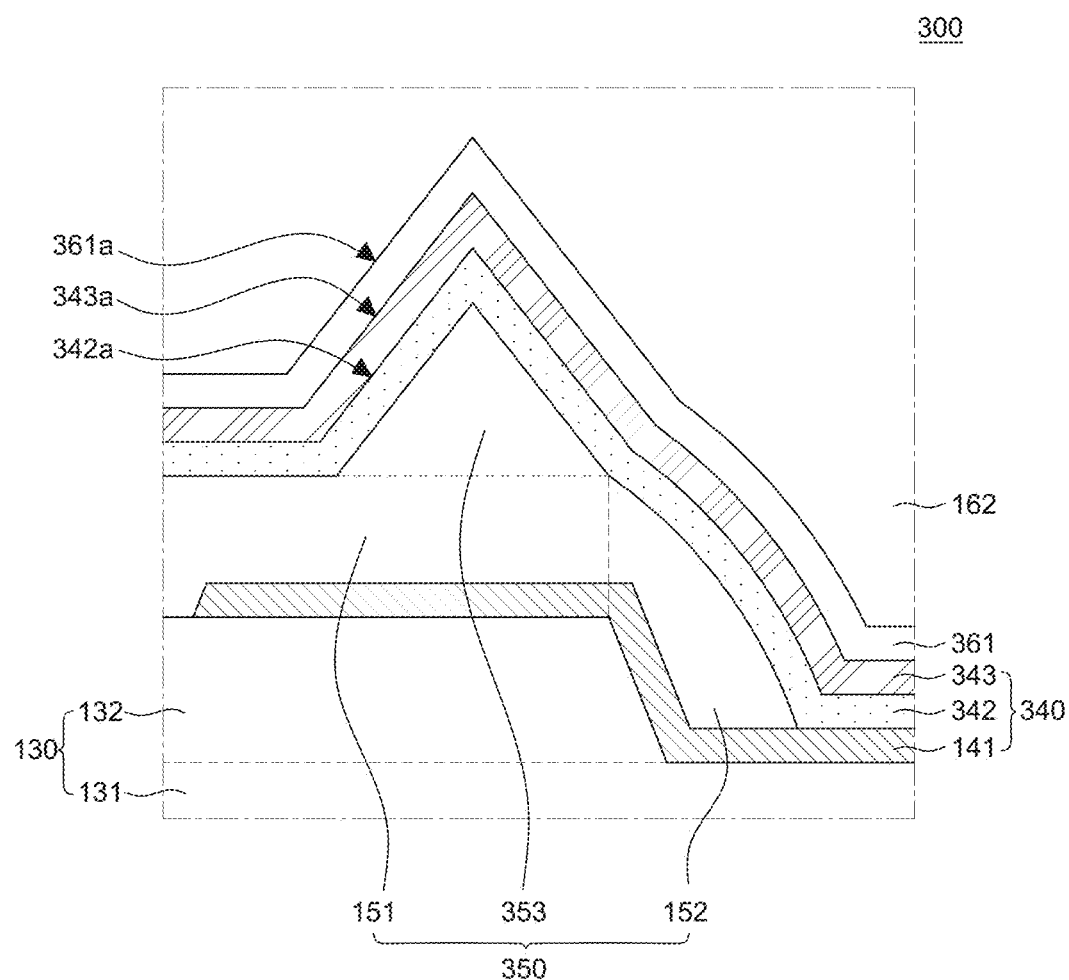
FIGS. 7A and 7B are enlarged views of a light emitting display apparatus according to another exemplary embodiment of the present disclosure.
Figure 7B:
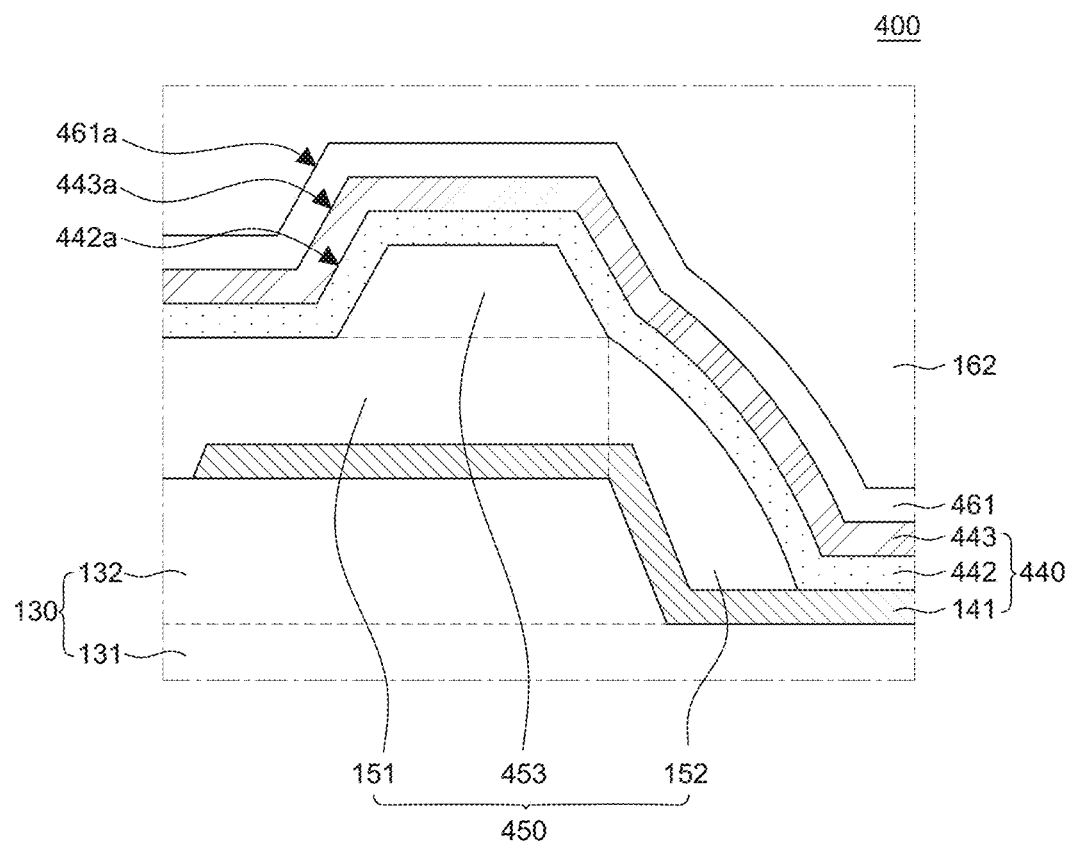

FIGS. 7A and 7B are enlarged views of a light emitting display apparatus according to another exemplary embodiment of the present disclosure. A bank layer 350, a light emitting diode 340, and a first encapsulation layer 361 of a light emitting display apparatus 300 of FIG. 7A are different from those of the light emitting display apparatus 100 of FIGS. 1 and 3, but other configurations are substantially the same so that a redundant description will be omitted or may be briefly provided. Further, a bank layer 450, a light emitting diode 440, and a first encapsulation layer 461 of a light emitting display apparatus 400 of FIG. 7B are different from those of the light emitting display apparatus 100 of FIGS. 1 and 3, but other configurations are substantially the same so that a redundant description will be omitted or may be briefly provided.

First, with reference to FIG. 7A, the bank layer 350 includes a first part 151, a second part 152, and a light extraction pattern 353. The light extraction pattern 353 of the bank layer 350 protrudes from the first part 151 to have a triangular shape.

The light emitting layer 342 includes a first protrusion pattern 342a corresponding to the light extraction pattern 353. The second electrode 343 includes a second protrusion pattern 343a corresponding to the light extraction pattern 353. The first encapsulation layer 361 includes a third protrusion pattern 361a corresponding to the light extraction pattern 353. For example, the light emitting layer 342, the second electrode 343, and the first encapsulation layer 361 are disposed in accordance with the shape of the light extraction pattern 353 disposed therebelow.

Next, with reference to FIG. 7B, the bank layer 450 includes a first part 151, a second part 152, and a light extraction pattern 453. The light extraction pattern 453 of the bank layer 450 protrudes from the first part 151 to have a trapezoidal shape.

The light emitting layer 142 includes a first protrusion pattern 442a corresponding to the light extraction pattern 453. The second electrode 443 includes a second protrusion pattern 443a corresponding to the light extraction pattern 453. The first encapsulation layer 461 includes a third protrusion pattern 461a corresponding to the light extraction pattern 453. For example, the light emitting layer 442, the second electrode 443, and the first encapsulation layer 461 are disposed in accordance with the shape of the light extraction pattern 453 disposed therebelow.

In the light emitting display apparatus 300 according to another exemplary embodiment of the present disclosure, the light extraction pattern 353 protruding with a triangular shape and the first protrusion pattern 342a, the second protrusion pattern 343a, and the third protrusion pattern 361a corresponding thereto are formed. Further, in the light emitting display apparatus 400 according to another exemplary embodiment of the present disclosure, the light extraction pattern 453 protruding with a trapezoidal shape and the first protrusion pattern 442a, the second protrusion pattern 443a, and the third protrusion pattern 461a corresponding thereto are formed. Therefore, in the light emitting display apparatuses 300 and 400 according to various exemplary embodiments of the present disclosure, the light extraction patterns 353 and 453 and the protrusion patterns 342a, 343a, 361a, 442a, 443a, and 461a can control the path of the light and improve the light extraction efficiency.

In FIGS. 2 to 7B, the light extraction patterns 153, 253, 353, and 453 have a semicircular shape, a convex pattern with a concave side surface, a triangular shape, and a trapezoidal shape, respectively, but it is not limited thereto and can have various shapes protruding upwardly. For example, as long as the shape can control the path of light and improve the light extraction efficiency, any shape can be applied regardless of the shape. For example, the enlarged view in FIG. 7A is an enlarged view of a part of the light emitting display apparatus 300, which would be similar to the part B of FIG. 2. Further the enlarged view in FIG. 7B is an enlarged view of a part of the light emitting display apparatus 400, which would be similar to the part B of FIG. 2.

Figure 8:
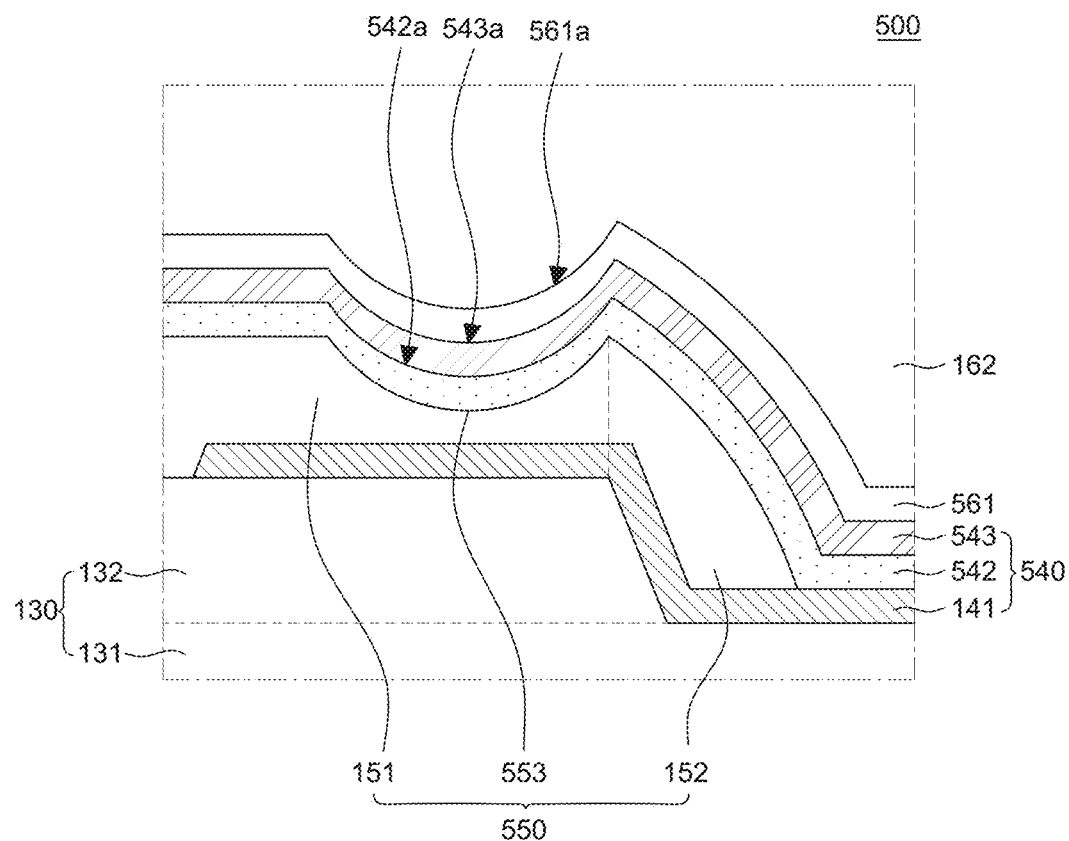
FIG. 8 is an enlarged view of a light emitting display apparatus according to another exemplary embodiment of the present disclosure.

FIG. 8 is an enlarged view of a light emitting display apparatus 500 according to another exemplary embodiment of the present disclosure. A bank layer 550, a light emitting diode 540, and a first encapsulation layer 561 of the light emitting display apparatus 500 of FIG. 8 are different from those of the light emitting display apparatus 100 of FIGS. 1 and 3, but other configurations are substantially the same so that a redundant description will be omitted or may be briefly provided. For example, the enlarged view in FIG. 8 is an enlarged view of a part of the light emitting display apparatus 500, which would be similar to the part B of FIG. 2.

With reference to FIG. 8, the bank layer 550 includes a first part 151, a second part 152, and a light extraction pattern 553. The light extraction pattern 553 is formed to have a concave pattern that is directed to the inside from the upper surface of the first part 151. For example, the light extraction pattern 553 can have a concave semicircular shape.

The light emitting layer 542 includes a first groove pattern 542a corresponding to the light extraction pattern 553. The second electrode 543 includes a second groove pattern 543a corresponding to the light extraction pattern 553. The first encapsulation layer 561 includes a third groove pattern 561a corresponding to the light extraction pattern 553. For example, the light emitting layer 542, the second electrode 543, and the first encapsulation layer 561 are disposed in accordance with the shape of the light extraction pattern 553 disposed therebelow.

In the light emitting display apparatus 500 according to another exemplary embodiment of the present disclosure, the light extraction pattern 553 having a concave semicircular shape and the first groove pattern 542a, the second groove pattern 543a, and the third groove pattern 561a corresponding thereto are formed. Therefore, the light extraction pattern 553 and the groove patterns 542a, 543a, and 561a can control the path of the light and improve the light extraction efficiency. The improvement of the light extraction efficiency using the light extraction pattern 553 will be described in more detail with reference to FIG. 9 together.

Figure 9:
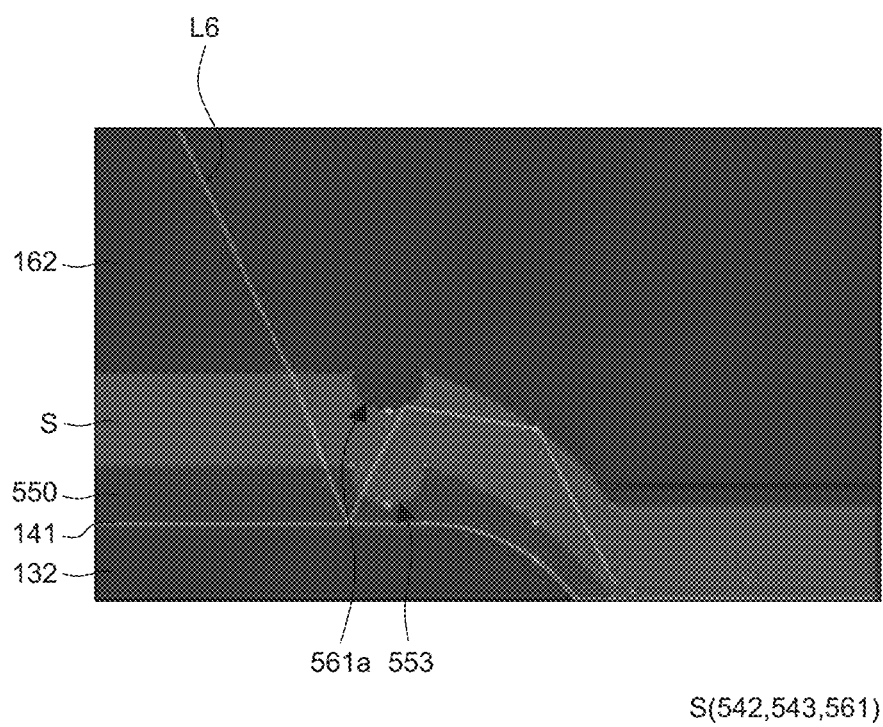
FIG. 9 is an example of a simulation result for describing a light extraction of a light emitting display apparatus according to another exemplary embodiment of the present disclosure.

FIG. 9 is an example of a simulation result for describing a light extraction of a light emitting display apparatus according to another exemplary embodiment of the present disclosure. FIG. 9 is an image obtained by simulating the light emitting display apparatus 500 according to another exemplary embodiment of the present disclosure using Ray Optics simulation program. For the convenience of description, only one light which can explain a simulation result is illustrated.

With reference to FIG. 9, a path of sixth light L6 emitted from the light emitting layer 542 of the area S is controlled by the light extraction pattern 553 and the third groove pattern 561a, and the light L6 can be extracted to the outside of the light emitting display apparatus 500. For example, the light extraction pattern 553 of the bank layer 550 and the third groove pattern 561a of the first encapsulation layer 561 have a semicircular shape that is inwardly concave. Therefore, the path of the light is changed due to the reflection of the sixth light L6 performed at the interface between the light extraction pattern 553 and the third groove pattern 561a and the amount of light extracted to the front surface of the light emitting display apparatus 500 can be increased.

For example, the sixth light L6 emitted from the light emitting layer 542 is totally reflected two times by an upper surface of an area S and the third groove pattern 561a and a traveling path of the sixth light can be changed. For example, the sixth light L6 is totally reflected two times at the interface between the area S disposed to be convex in accordance with the shape of the light extraction pattern 553 and the foreign material cover layer 162, and passes through the bank layer 550 and is reflected by the first electrode 141. Thereafter, the sixth light L6 passes through the bank layer 550, the area S, and the foreign material cover layer 562, and is extracted to the outside of the light emitting display apparatus 500. For example, a path of the sixth light L6 is changed by the shape of the light extraction pattern 553 and the third groove pattern 561a and the sixth light L6 is reflected by the first electrode 141 to travel with a small incident angle. Therefore, the sixth light L6 can be extracted to the front surface of the light emitting display apparatus 500.

Therefore, in the light emitting display apparatus 500 according to another exemplary embodiment of the present disclosure, the light extraction efficiency can be improved by the light extraction pattern 553 of the bank layer 550. When the light extraction pattern 553 is omitted, and the upper surface of the bank layer 550 has a flat or plane shape, the sixth light L6 can be trapped in the area S due to the total reflection and lost due to the total reflection. However, in the light emitting display apparatus 500 according to another exemplary embodiment of the present disclosure, a reflective angle of the light that can be trapped between the foreign material cover layer 162 and the bank layer 550 can be changed by the concave semicircular shape of the light extraction pattern 553 of the bank layer 550. Therefore, the light that is extracted to the front surface of the light emitting apparatus 500 can be increased. Accordingly, the light extraction efficiency of the light emitting display apparatus 500 can be improved and the power consumption can be improved.

Figure 10:
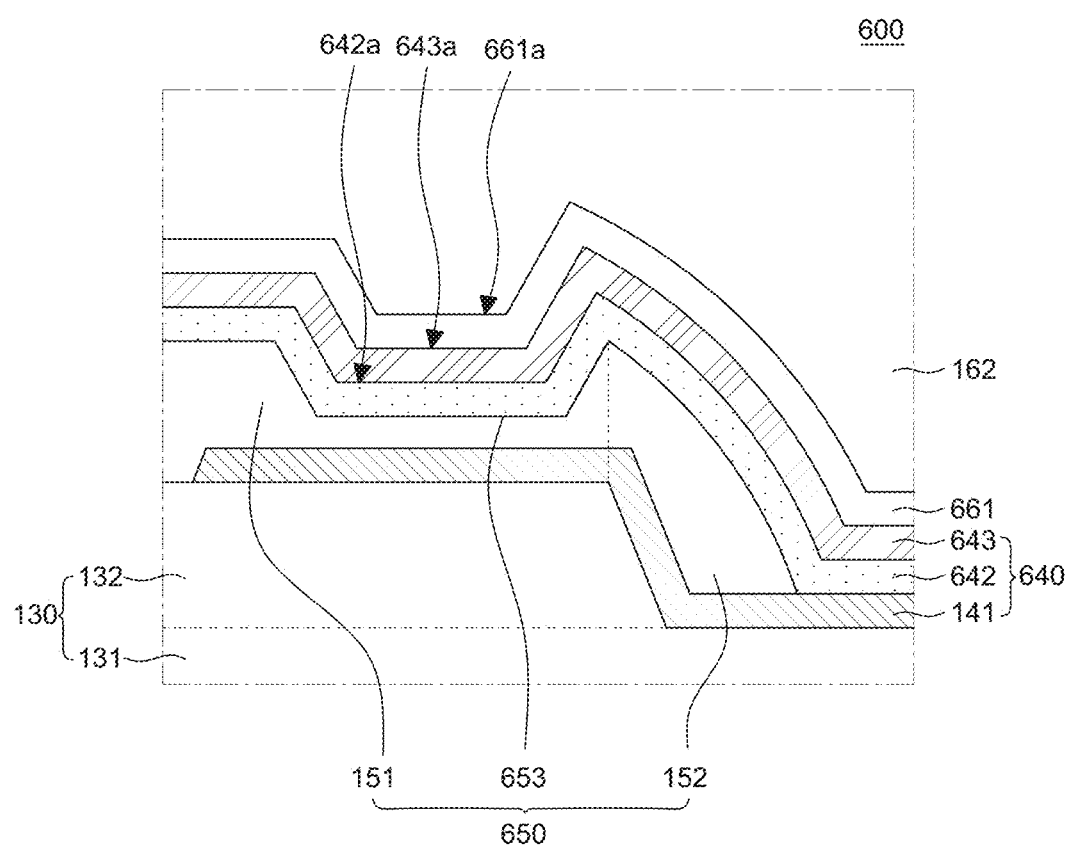
FIG. 10 is an enlarged view of a light emitting display apparatus according to another exemplary embodiment of the present disclosure.

FIG. 10 is an enlarged view of a light emitting display apparatus 600 according to another exemplary embodiment of the present disclosure. A bank layer 650, a light emitting diode 640, and a first encapsulation layer 661 of the light emitting display apparatus 600 of FIG. 10 are different from those of the light emitting display apparatus 500 of FIG. 8, but other configurations are substantially the same so that a redundant description will be omitted or may be briefly provided. For example, the enlarged view in FIG. 10 is an enlarged view of a part of the light emitting display apparatus 600, which would be similar to the part B of FIG. 2.

With reference to FIG. 10, the bank layer 650 includes a first part 151, a second part 152, and a light extraction pattern 653. The light extraction pattern 653 of the bank layer 650 is formed as a trapezoidal-shaped groove that is directed to the inside from the first part 151. For example, the light extraction pattern 653 can be a groove having a concave trapezoidal shape. The trapezoidal shape can have a lower surface that is smaller than an upper surface.

The light emitting layer 642 includes a first groove pattern 642a corresponding to the light extraction pattern 653. The second electrode 643 includes a second groove pattern 643a corresponding to the light extraction pattern 653. The first encapsulation layer 661 includes a third groove pattern 661a corresponding to the light extraction pattern 653. For example, the light emitting layer 642, the second electrode 643, and the first encapsulation layer 661 are disposed in accordance with the shape of the light extraction pattern 653 disposed therebelow.

In the light emitting display apparatus 600 according to another exemplary embodiment of the present disclosure, the light extraction pattern 653 having a concave trapezoidal shape and the first groove pattern 642a, the second groove pattern 643a, and the third groove pattern 661a corresponding thereto are formed. Therefore, the light extraction pattern 653 and the groove patterns 642a, 643a, and 661a can control the path of the light and improve the light extraction efficiency. The improvement of the light extraction efficiency using the light extraction pattern 653 will be described in more detail with reference to FIG. 11 together.

Figure 11:
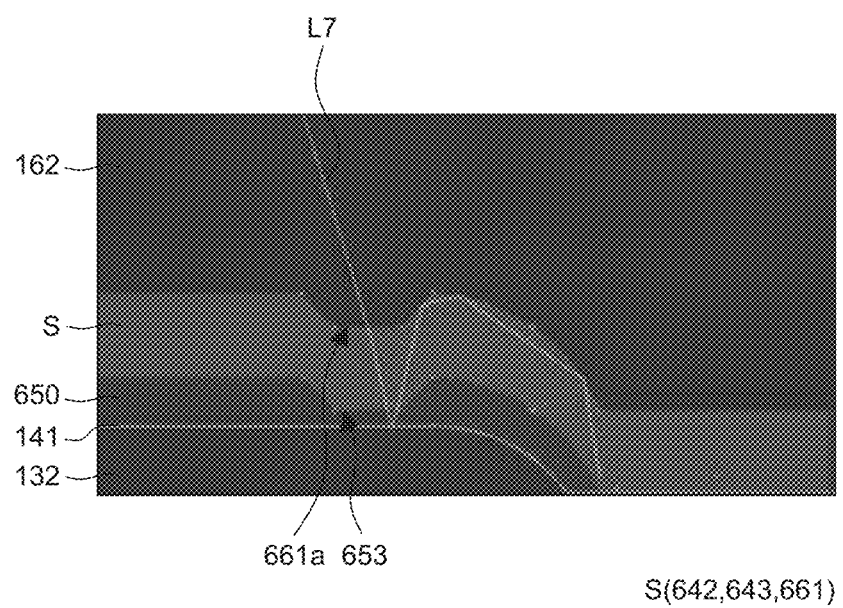
FIG. 11 is an example of a simulation result for describing a light extraction of a light emitting display apparatus according to another exemplary embodiment of the present disclosure.

FIG. 11 is an example of a simulation result for describing a light extraction of a light emitting display apparatus according to another exemplary embodiment of the present disclosure. FIG. 11 is an image obtained by simulating a light emitting display apparatus 600 according to another exemplary embodiment of the present disclosure using Ray Optics simulation program. For the convenience of description, only one light which is extracted to the front surface is illustrated as a simulation result.

With reference to FIG. 11, a path of seventh light L7 emitted from the light emitting layer 642 of the area S is controlled by the light extraction pattern 653 and a third groove pattern 661a, and the light L7 can be extracted to the outside of the light emitting display apparatus. For example, the light extraction pattern 653 of the bank layer 650 and the third groove pattern 661a of the first encapsulation layer 661 have a concave trapezoidal shape. Therefore, the path of the light is changed due to the reflection of the seventh light L7 at the interface therebetween and the amount of light extracted to the front surface of the light emitting display apparatus 600 can be increased.

For example, the seventh light L7 emitted from the light emitting layer 642 is totally reflected three times by an upper surface of the area S and a traveling path of the seventh light can be changed. For example, the seventh light L7 is totally reflected three times at the interface between the area S disposed to be concave in accordance with the shape of the light extraction pattern 653 and the foreign material cover layer 162 and passes through the bank layer 650 to be reflected by the first electrode 141. Thereafter, the seventh light L7 passes through the bank layer 650, the area S, and the foreign material cover layer 162, and is extracted to the outside of the light emitting display apparatus 600. For example, a path of the seventh light L7 is changed by the shape of the light extraction pattern 653 and the third groove pattern 661a and the seventh light L7 is reflected by the first electrode 141, and travels with a small incident angle. Therefore, the seventh light L7 is extracted to the front surface of the light emitting display apparatus 600.

Therefore, in the light emitting display apparatus 600 according to another exemplary embodiment of the present disclosure, the light extraction efficiency can be improved by the light extraction pattern 653 of the bank layer 650. When the light extraction pattern 653 is omitted, and the upper surface of the bank layer 650 has a flat or plane shape, the seventh light L7 can be trapped in the area S due to the total reflection and lost due to the total reflection. However, in the light emitting display apparatus 600 according to another exemplary embodiment of the present disclosure, a reflective angle of the light which can be trapped between the foreign material cover layer 162 and the bank layer 650 can be changed by the concave trapezoidal shape of the light extraction pattern 653 of the bank layer 650. Therefore, the light that is extracted to the front surface of the light emitting apparatus 600 can be increased. Accordingly, the light extraction efficiency of the light emitting display apparatus 600 can be improved and the power consumption can be improved.

Figure 12A:
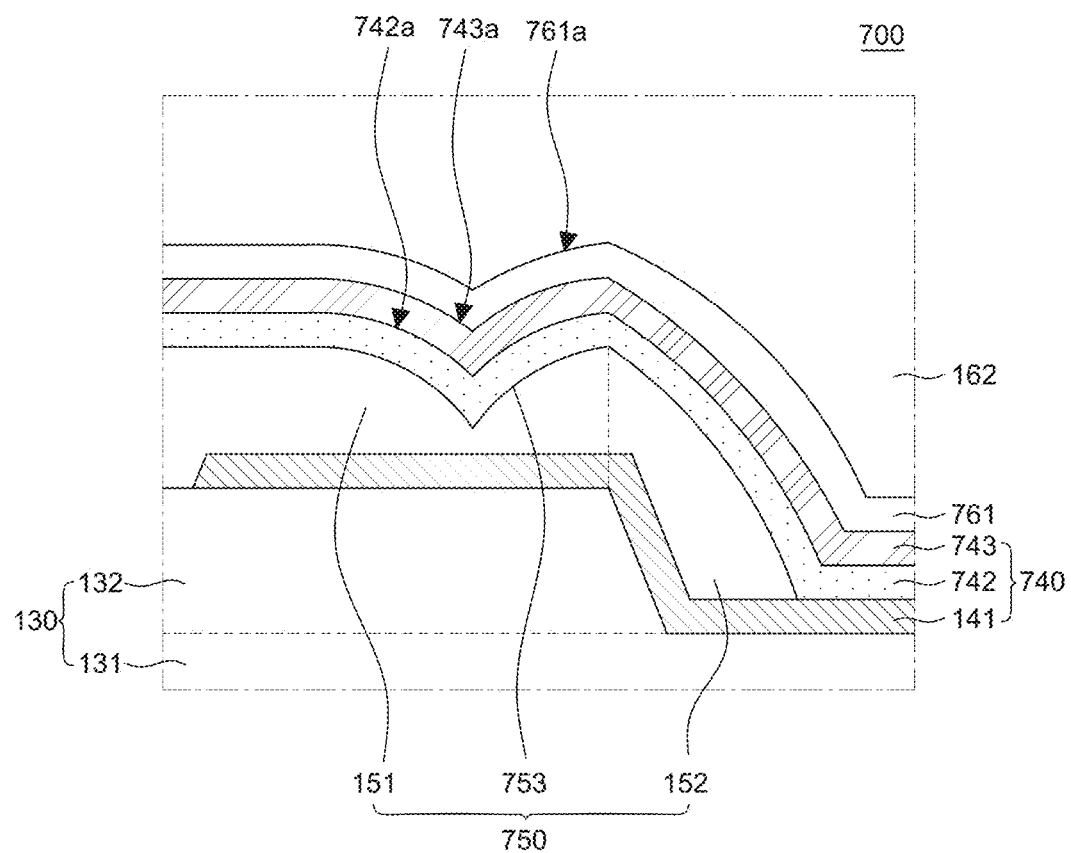
FIGS. 12A and 12B are enlarged views of a light emitting display apparatus according to another exemplary embodiment of the present disclosure.
Figure 12B:
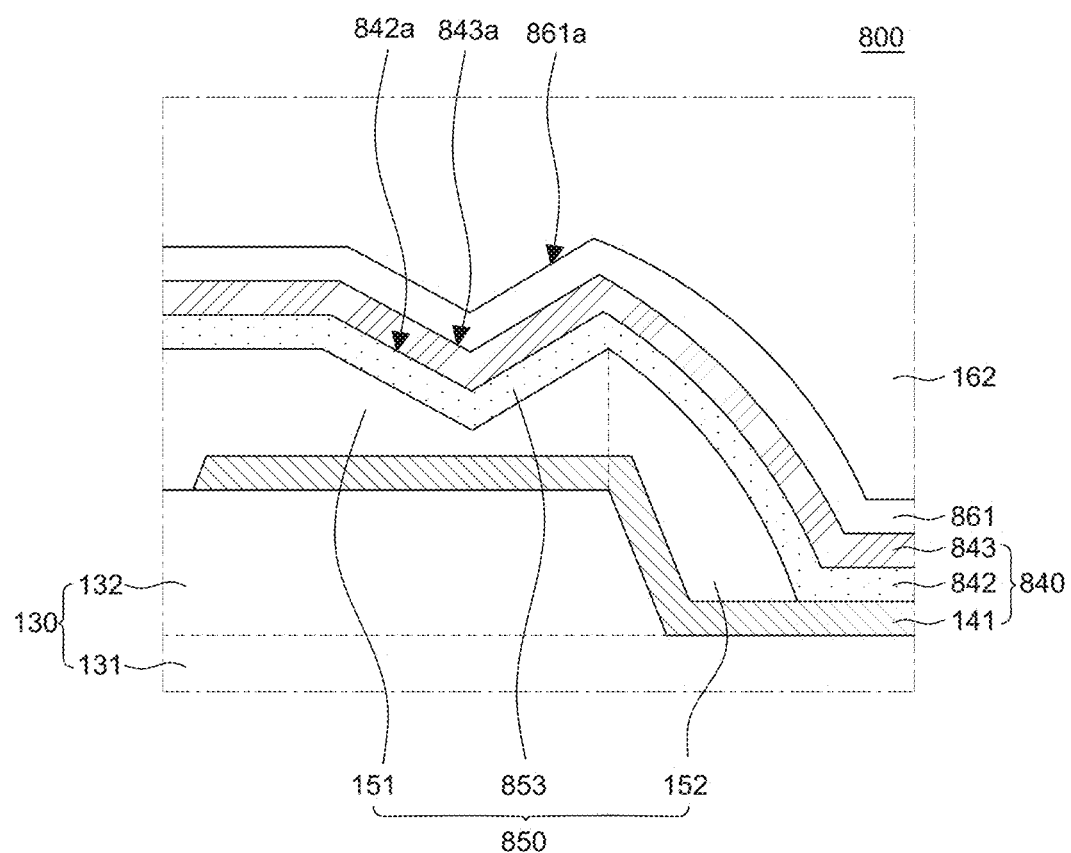

FIGS. 12A and 12B are enlarged views of a light emitting display apparatus according to another exemplary embodiment of the present disclosure. A bank layer 750, a light emitting diode 740, and a first encapsulation layer 761 of a light emitting display apparatus 700 of FIG. 12A are different from those of the light emitting display apparatus 500 of FIG. 8, but other configurations are substantially the same so that a redundant description will be omitted or may be briefly provided. A bank layer 850, a light emitting diode 840, and a first encapsulation layer 861 of a light emitting display apparatus 800 of FIG. 12B are different from those of the light emitting display apparatus 500 of FIG. 8, but other configurations are substantially the same so that a redundant description will be omitted or may be briefly provided. For example, the enlarged view in FIG. 12A is an enlarged view of a part of the light emitting display apparatus 700, which would be similar to the part B of FIG. 2. The enlarged view in FIG. 12B is an enlarged view of a part of the light emitting display apparatus 800, which would be similar to the part B of FIG. 2.

First, with reference to FIG. 12A, the bank layer 750 includes a first part 151, a second part 152, and a light extraction pattern 753. The light extraction pattern 753 of the bank layer 750 is formed as a concave pattern with a convex side surface toward the inside from the first part 151. For example, surfaces between an apex of a lowermost edge of the light extraction pattern 753 and the first part 151 and the second part 152 can be formed as convex curved surfaces.

The light emitting layer 742 includes a first groove pattern 742a corresponding to the light extraction pattern 753. The second electrode 743 includes a second groove pattern 743a corresponding to the light extraction pattern 753. The first encapsulation layer 761 includes a third groove pattern 761a corresponding to the light extraction pattern 753. For example, the light emitting layer 742, the second electrode 743, and the first encapsulation layer 761 are disposed in accordance with the shape of the light extraction pattern 753 disposed therebelow.

Next, with reference to FIG. 12B, the bank layer 850 includes a first part 151, a second part 152, and a light extraction pattern 853. The light extraction pattern 853 of the bank layer 850 is formed as a triangular shaped groove that is directed to the inside from the first part 151.

The light emitting layer 842 includes a first groove pattern 842a corresponding to the light extraction pattern 853. The second electrode 843 includes a second groove pattern 843a corresponding to the light extraction pattern 853. The first encapsulation layer 861 includes a third groove pattern 861a corresponding to the light extraction pattern 853. For example, the light emitting layer 842, the second electrode 843, and the first encapsulation layer 861 are disposed in accordance with the shape of the light extraction pattern 853 disposed therebelow.

In the light emitting display apparatus 700 according to another exemplary embodiment of the present disclosure, the light extraction pattern 753 having a concave pattern with a convex side surface and the first groove pattern 742a, the second groove pattern 743a, and the third groove pattern 761a corresponding thereto are formed. In the light emitting display apparatus 800 according to another exemplary embodiment of the present disclosure, the light extraction pattern 853 having a concave triangular shape and the first groove pattern 842a, the second groove pattern 843a, and the third groove pattern 861*a* corresponding thereto are formed. Therefore, in the light emitting display apparatuses 700 and 800 according to various exemplary embodiments of the present disclosure, the light extraction patterns 753 and 853 and the groove patterns 742*a*, 743*a*, 761*a*, 842*a*, 843*a*, and 861*a* can control the path of the light and improve the light extraction efficiency.

Figure 13A:
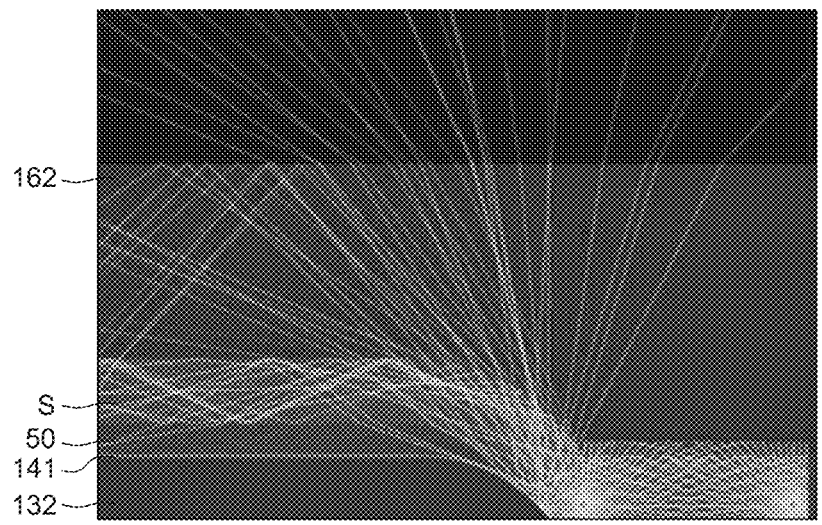
FIGS. 13A to 13G are examples of simulation results of a light extracting path according to various exemplary embodiments of the present disclosure and comparative example.
Figure 13B:
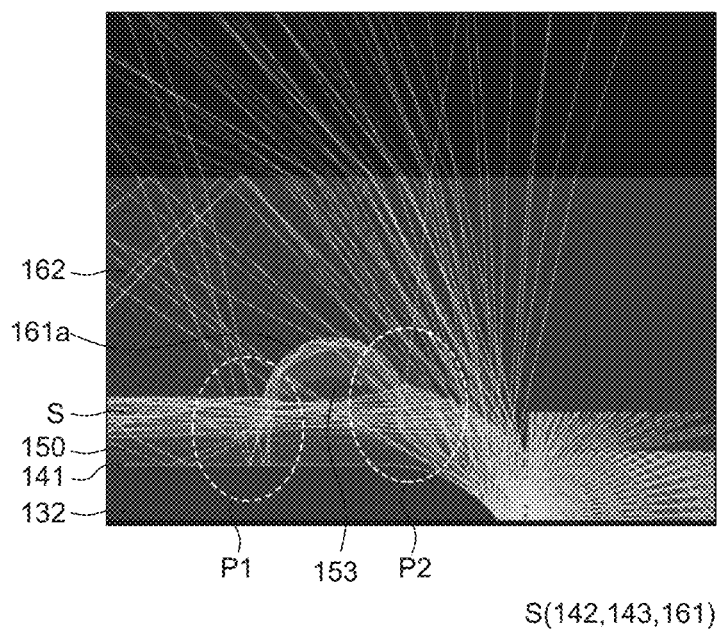
Figure 13C:
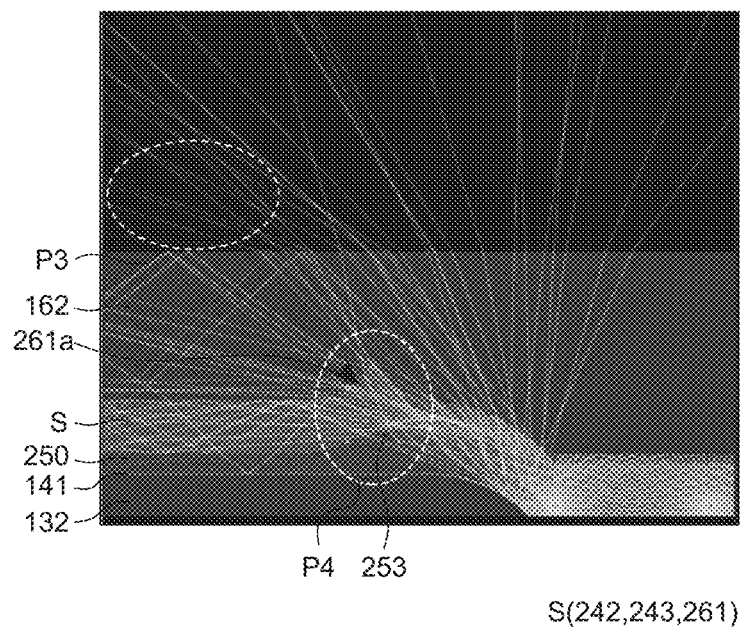
Figure 13D:
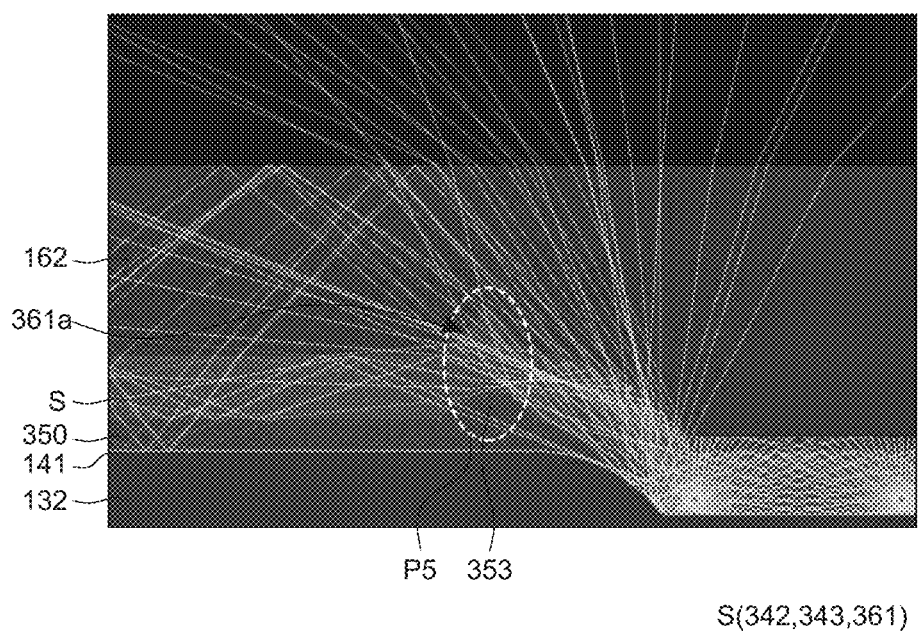
Figure 13E:
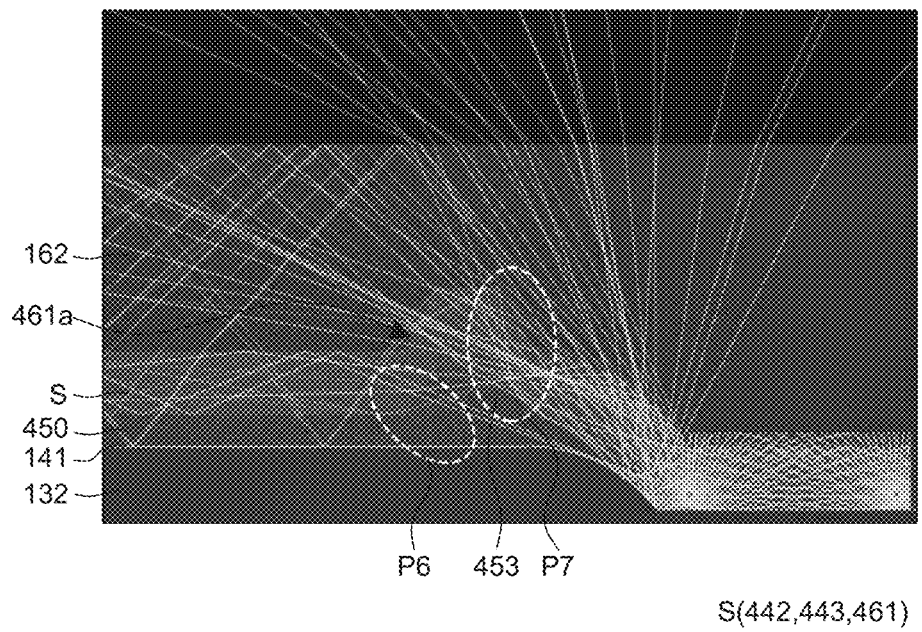
Figure 13F:
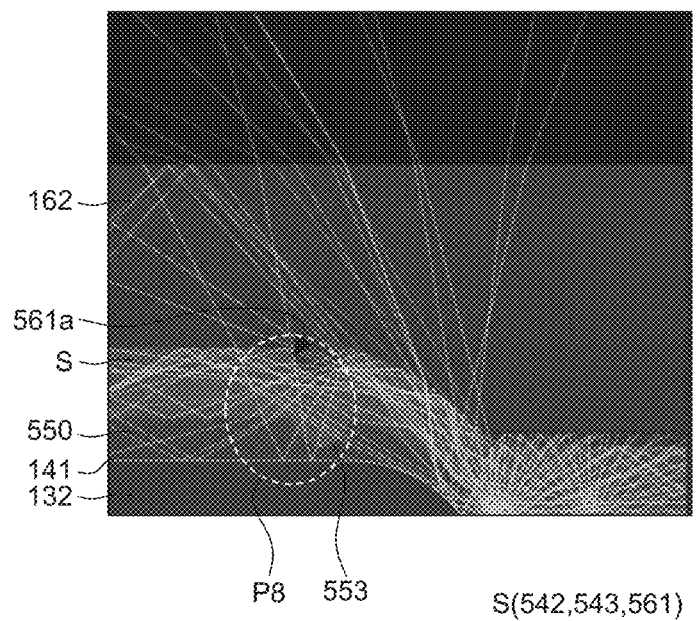
Figure 13G:
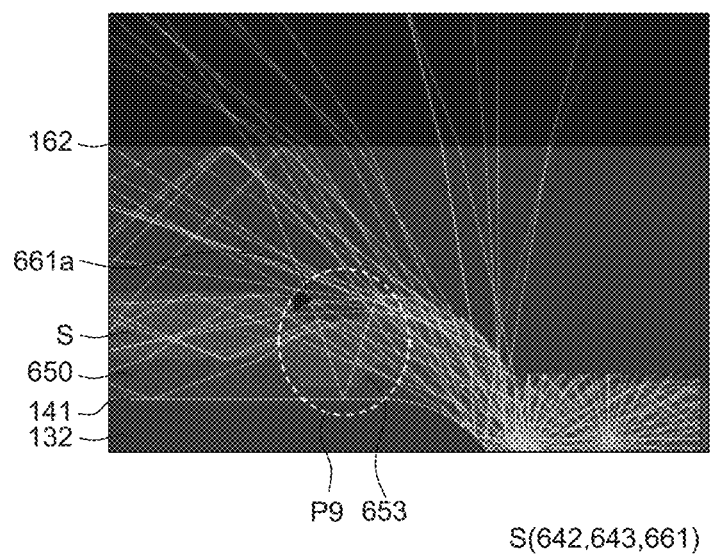

FIGS. 13A to 13G are examples of simulation results of a light extracting path according to embodiments of the present disclosure and comparative example of a light emitting display apparatus according to various exemplary embodiments of the present disclosure. FIG. 13B is a simulation image of the light emitting display apparatus 100 illustrated in FIGS. 1 and 3. FIG. 13C is a simulation image of the light emitting display apparatus 200 illustrated in FIG. 5. FIG. 13D is a simulation image of the light emitting display apparatus 300 illustrated in FIG. 7A. FIG. 13E is a simulation image of the light emitting display apparatus 400 illustrated in FIG. 7B. FIG. 13F is a simulation image of the light emitting display apparatus 500 illustrated in FIG. 8. FIG. 13G is a simulation image of the light emitting display apparatus 600 illustrated in FIG. 10. FIG. 13A is a simulation image of a light emitting display apparatus according to comparative example. Since an upper surface of a bank layer 50 is flat, a light emitting display apparatus according to comparative example does not include a light extraction pattern. Therefore, all of a light emitting layer 42, a second electrode 43, and a first encapsulation layer 61 on the bank layer 50 have flat shapes. FIGS. 13A to 13G illustrate images of simulation using Ray Optics simulation program and the simulation performed with regard to FIGS. 13A to 13G is the simulation for light extraction generated on a side portion and an upper portion of the protrusion portion 132. Therefore, light emitted to a center area is omitted. Further, in FIGS. 13A to 13G, it is assumed that air is disposed above the foreign material cover layer 162 and a refractive index of air is set to 1.

First, with reference to FIG. 13A, in the light emitting display apparatus according to the comparative example, an upper surface of the bank layer 50 is flat shape. The light emitting display apparatus according to comparative example does not include the light extraction pattern as included in various exemplary embodiments of the present disclosure. Therefore, all of the light emitting layer 42, the second electrode 43, and the first encapsulation layer 61 on the bank layer 50 have a flat shape. Therefore, with reference to FIG. 13A, a plurality of light is still trapped in the area S. Further, some light with a light path that is changed near a side portion of the protrusion portion 132 with a changing slope is extracted to the outside, but extracted at an elevation angle or large angle. Therefore, it is confirmed that the light has a large incident angle, and thus, the light is not extracted to the outside of the foreign material cover layer 162 and most of the light is trapped at the interface between the foreign material cover layer 162 and the air due to the total reflection.

With reference to FIG. 13B, in the light emitting display apparatus 100 according to an exemplary embodiment of the present disclosure, the light extraction efficiency can be increased using the light extraction pattern 153 having a convex semicircular shape. First, with reference to a first point P1 of FIG. 13B, some of light emitted from the light emitting layer 142 is totally reflected multiple times at the interface of the area S disposed to be convex in accordance with the shape of the light extraction pattern 153 and the foreign material cover layer 162, and thus, the traveling path is changed. Further, the light is reflected by the first electrode 141 and is extracted to the front direction of the light emitting display apparatus 100. Further, with reference to a second point P2 of FIG. 13B, some of light emitted from the light emitting layer 142 is totally reflected through the upper surface of the light extraction pattern 153, and thus, extracted to the front direction of the light emitting display apparatus 100. Accordingly, in the light emitting display apparatus 100 according to an exemplary embodiment of the present disclosure, the light extraction pattern 153 having a convex semicircular shape is used to increase the light extraction efficiency and specifically, improve a front efficiency.

Next, with reference to FIG. 13C, in the light emitting display apparatus 200 according to another exemplary embodiment of the present disclosure, the light extraction pattern 253 having a convex pattern with a concave side surface is used to increase the light extraction efficiency and can improve a viewing angle. First, with reference to a third point P3 of FIG. 13C, some of light emitted from the light emitting layer 242 is totally reflected through the upper surface of the light extraction pattern 253, and thus, extracted to the front direction of the light emitting display apparatus 200. Further, with reference to a fourth point P4 of FIG. 13C, some of light emitted from the light emitting layer 242 is totally reflected through the upper surface of the light extraction pattern 253, and thus, some light is extracted to the side direction of the light emitting display apparatus 200. Accordingly, in the light emitting display apparatus 200 according to another exemplary embodiment of the present disclosure, the light extraction pattern 253 having a convex pattern with a concave side surface is used to increase the light extraction efficiency and improve a viewing angle.

Next, with reference to FIG. 13D, in the light emitting display apparatus 300 according to another exemplary embodiment of the present disclosure, the light extraction pattern 353 that protrudes in a triangular shape is used to increase the light extraction efficiency. First, with reference to a fifth point P5 of FIG. 13D, some of light emitted from the light emitting layer 342 is totally reflected through the upper surface of the light extraction pattern 353, and thus, some light is extracted to the front direction of the light emitting display apparatus 300. Accordingly, in the light emitting display apparatus 300 according to another exemplary embodiment of the present disclosure, the light extraction pattern 353 that protrudes in a triangular shape is used to increase the light extraction efficiency, and specifically, improve a front efficiency.

Next, with reference to FIG. 13E, in the light emitting display apparatus 400 according to another exemplary embodiment of the present disclosure, the light extraction pattern 453 that protrudes in a trapezoidal shape is used to increase the light extraction efficiency. First, with reference to a sixth point P6 of FIG. 13E, some of light emitted from the light emitting layer 442 is totally reflected plural times at the interface of the area S that protrudes in a trapezoidal shape in accordance with the shape of the light extraction pattern 453 and the foreign material cover layer 162 and the traveling path is changed. Further, the light is reflected by the first electrode 141 and extracted to the front direction of the light emitting display apparatus 400. Further, with reference to a seventh point P7 of FIG. 13E, some of light emitted from the light emitting layer 442 is totally reflected through the upper surface of the light extraction pattern 453, and thus, some light is extracted to the front direction of the light emitting display apparatus 400. Accordingly, in the light emitting display apparatus 400 according to another exemplary embodiment of the present disclosure, the light extraction pattern 453 that protrudes in a trapezoidal shape is used to increase the light extraction efficiency, and specifically, improve a front efficiency.

Next, with reference to FIG. 13F, in the light emitting display apparatus 500 according to another exemplary embodiment of the present disclosure, the light extraction pattern 553 with a concave semicircular shape is used to increase the light extraction efficiency. First, with reference to an eighth point P8 of FIG. 13F, some of light emitted from the light emitting layer 542 is totally reflected multiple times at the interface of the area S having a concave semicircular shape in accordance with the shape of the light extraction pattern 553 and the foreign material cover layer 162 and the traveling path is changed. Further, the light is reflected by the first electrode 141 and extracted to the front direction of the light emitting display apparatus 500. Accordingly, in the light emitting display apparatus 500 according to another exemplary embodiment of the present disclosure, the light extraction pattern 553 having a concave semicircular shape is used to increase the light extraction efficiency, and specifically, improve a front efficiency.

Next, with reference to FIG. 13G, in the light emitting display apparatus 600 according to another exemplary embodiment of the present disclosure, the light extraction pattern 653 with a concave trapezoidal shape is used to increase the light extraction efficiency. First, with reference to a ninth point P9 of FIG. 13G, some of light emitted from the light emitting layer 642 is totally reflected at the interface of the area S having a concave trapezoidal shape in accordance with the shape of the light extraction pattern 653 and the foreign material cover layer 162 and the traveling path is changed. Further, the light is reflected by the first electrode 141 to be extracted to the front direction of the light emitting display apparatus 600. Accordingly, in the light emitting display apparatus 600 according to another exemplary embodiment of the present disclosure, the light extraction pattern 653 having a concave trapezoidal shape is used to increase the light extraction efficiency, and specifically, improve a front efficiency.

The light extraction efficiency and the front efficiency of various exemplary embodiments of the present disclosure and the comparative example as described above are represented in the following Tables 1 and 2.

TABLE 1

|  | Number of light | Rate of increase (%) |
| --- | --- | --- |
| Comparative example | 24 | — |
| Embodiment 1 (light emitting display apparatus 100) | 27 | 12.5% |
| Embodiment 2 (light emitting display apparatus 500) | 26 | 8.3% |

TABLE 2

|  | Number of light | Rate of increase (%) |
| --- | --- | --- |
| Comparative example | 9 | — |
| Embodiment 1 (light emitting display apparatus 100) | 11 | 22.2% |
| Embodiment 2 (light emitting display apparatus 500) | 11 | 22.2% |

First, Table 1 represents an entire light extraction efficiency of comparative example and embodiments of the present disclosure With reference to Table 1, it is confirmed that as compared with the light emitting display apparatus without a light extraction pattern as in comparative example, in the light emitting display apparatus 100 according to an exemplary embodiment of the present disclosure that is embodiment 1, light extracted to the outside of the light emitting display apparatus 100 is increased by 12.5%. It is confirmed that in the light emitting display apparatus 500 according to another exemplary embodiment of the present disclosure that is embodiment 2, light extracted to the outside of the light emitting display apparatus 500 is increased by 8.3%

Further, Table 2 represents the front efficiency of comparative example and embodiments of the present disclosure. Here, the front efficiency refers to an extraction efficiency of light with a viewing angle between −10 degrees and +10 degrees, with respect to the front surface of the light emitting display apparatus. With reference to Table 2, it is confirmed that as compared with the light emitting display apparatus without a light extraction pattern as in comparative example, in both the light emitting display apparatus 100 according to an exemplary embodiment of the present disclosure that is embodiment 1 and the light emitting display apparatus 500 according to another exemplary embodiment of the present disclosure that is embodiment 2, light extracted to the front direction of the light emitting display apparatuses 100 and 500 is increased by 22.2%.

A light emitting display apparatus according to one or more embodiments of the present disclosure will be described below.

A light emitting display apparatus according to an embodiment of the present disclosure includes a substrate. The light emitting display apparatus further includes an overcoating layer on the substrate and including a base portion and a protrusion portion. The light emitting display apparatus further includes a first electrode disposed to cover the base portion and a side portion of the protrusion portion. The light emitting display apparatus further includes a bank layer on a part of the first electrode. The light emitting display apparatus further includes a light emitting layer on the first electrode and the bank layer. The light emitting display apparatus further includes a second electrode on the light emitting layer. The bank layer includes: a first part on the protrusion portion; a second part surrounding the first part and including an inclined upper surface; and a light extraction pattern on the first part adjacent to the second part.

According to some embodiments of the present disclosure, the light extraction pattern can be disposed on the protrusion portion.

According to some embodiments of the present disclosure, the first electrode can include a reflective layer and can be disposed between the protrusion portion and the light extraction pattern.

According to some embodiments of the present disclosure, the light extraction pattern can protrude from an upper surface of the first part.

According to some embodiments of the present disclosure, a shape of the light extraction pattern can have one of a semicircle, a convex pattern with a concave side surface, a triangle, and a trapezoid.

According to some embodiments of the present disclosure, a gradient of a tangent line of a part of the light extraction pattern adjacent to the second part can be larger than a gradient of a tangent line of a part of the second part adjacent to the light extraction pattern.

According to some embodiments of the present disclosure, the light extraction pattern can include a concave pattern toward the inside from an upper surface of the first part.

According to some embodiments of the present disclosure, the light extraction pattern can have any one shape of a semicircle, the concave pattern with a convex side surface, a triangle, and a trapezoid.

According to some embodiments of the present disclosure, the light emitting layer and the second electrode can be disposed to correspond to a shape of the light extraction pattern.

According to some embodiments of the present disclosure, the light emitting display apparatus can further include a first encapsulation layer on the second electrode. The light emitting display apparatus can further include a foreign material cover layer on the first encapsulation layer. The first encapsulation layer can be disposed to correspond to a shape of the second electrode.

According to some embodiments of the present disclosure, a refractive index of the bank layer can be smaller than a refractive index of the light emitting layer and a refractive index of the foreign material cover layer can be smaller than a refractive index of the first encapsulation layer.

A light emitting display apparatus according to an embodiment of the present disclosure includes a substrate. The light emitting display apparatus further includes an overcoating layer on the substrate and including a base portion and a protrusion portion. The light emitting display apparatus further includes a light emitting diode on the overcoating layer and including a first electrode, a light emitting layer, and a second electrode. The light emitting display apparatus further includes a bank layer between the first electrode and the light emitting layer and defining an emission area. The light emitting display apparatus further includes an encapsulation unit on the light emitting diode and including a first encapsulation layer, a foreign material cover layer, and a second encapsulation layer. An upper surface of the bank layer includes a concave pattern or a convex pattern on an inclined surface extending from the emission area, a flat surface spaced apart from the inclined surface, and the flat surface adjacent to the inclined surface to improve a light extraction efficiency and a front efficiency for light emitted from the light emitting diode.

According to some embodiments of the present disclosure, the concave pattern or the convex pattern can be disposed to surround the emission area.

According to some embodiments of the present disclosure, the concave pattern or the convex pattern can be disposed on the protrusion portion and the first electrode.

According to some embodiments of the present disclosure, a slope of the concave pattern or the convex pattern adjacent to the inclined surface can be steeper than a slope of the inclined surface adjacent to the concave pattern or the convex pattern.

According to some embodiments of the present disclosure, a refractive index of the bank layer can be smaller than a refractive index of the light emitting layer, a refractive index of the foreign material cover layer can be smaller than a refractive index of the first encapsulation layer, and the light emitting layer, the second electrode, and the first encapsulation layer can be disposed to correspond to a shape of the concave pattern or the convex pattern.

According to some embodiments of the present disclosure, the concave pattern or the convex pattern can have any one shape of a semicircle, a pattern with a concave or convex side surface, a triangle, and a trapezoid.

A light emitting display apparatus according to an embodiment of the present disclosure includes an overcoating layer including a base portion and a protrusion portion. The light emitting display apparatus further includes a first electrode disposed to cover the base portion and a side portion of the protrusion portion. The light emitting display apparatus further includes a bank layer on a part of the first electrode. The light emitting display apparatus further includes a light emitting layer on the first electrode and the bank layer. The light emitting display apparatus further includes a second electrode on the light emitting layer. The bank layer includes a first part on the protrusion portion of the overcoating layer, a second part surrounding the first part and including an inclined upper surface, and a light extraction pattern on the first part adjacent to the second part. The second electrode can be configured to reflect light emitted from the light emitting layer toward the second electrode.

According to some embodiments of the present disclosure, the first electrode includes a reflective layer and the reflective layer covers the base portion and the side portion of the protrusion portion.

According to some embodiments of the present disclosure, the light emitting layer includes a first protrusion pattern corresponding to the light extraction pattern of the bank layer, and the second electrode includes a second protrusion pattern corresponding to the first protrusion pattern.

According to some embodiments of the present disclosure, the light emitting display apparatus further includes an encapsulation layer on the second electrode, the light emitting layer includes a first protrusion pattern corresponding to the light extraction pattern of the bank layer, the second electrode includes a second protrusion pattern corresponding to the first protrusion pattern, and the encapsulation layer includes a third protrusion pattern corresponding to the second protrusion pattern.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. A light emitting display apparatus, comprising:
   an overcoating layer on a substrate and including a base portion and a protrusion portion;
   a first electrode disposed to cover the base portion and a side portion of the protrusion portion;
   a bank layer on a part of the first electrode;
   a light emitting layer on the first electrode and the bank layer;
   a second electrode on the light emitting layer;
   a foreign material cover layer planarizing an upper portion of the second electrode; and
   a first encapsulation layer between the second electrode and the foreign material cover layer, wherein the bank layer includes:
a first part on the protrusion portion of the overcoating layer;
a second part surrounding the first part and including an inclined upper surface; and
a light extraction pattern on the first part adjacent to the second part,
wherein the first encapsulation layer includes a pattern having a shape corresponding to a shape of the light extraction pattern, and
wherein a refractive index of the bank layer is smaller than a refractive index of the light emitting layer, and a refractive index of the foreign material cover layer is smaller than a refractive index of the first encapsulation layer.

2. The light emitting display apparatus of claim 1, wherein the light extraction pattern is disposed on the protrusion portion of the overcoating layer.

3. The light emitting display apparatus of claim 1, wherein the first electrode includes a reflective layer and is disposed between the protrusion portion of the overcoating layer and the light extraction pattern.

4. The light emitting display apparatus of claim 1, wherein the light extraction pattern protrudes from an upper surface of the first part of the bank layer.

5. The light emitting display apparatus of claim 4, wherein the shape of the light extraction pattern has one of a semicircle, a convex pattern with a concave side surface, a triangle, and a trapezoid.

6. The light emitting display apparatus of claim 4, wherein a gradient of a tangent line of a part of the light extraction pattern adjacent to the second part of the bank layer is larger than a gradient of a tangent line of a part of the second part adjacent to the light extraction pattern.

7. The light emitting display apparatus of claim 1, wherein the light extraction pattern includes a concave pattern toward the inner portion from an upper surface of the first part of the bank layer.

8. The light emitting display apparatus of claim 7, wherein the shape of the light extraction pattern has one of a semicircle, the concave pattern with a convex side surface, a triangle, and a trapezoid.

9. The light emitting display apparatus of claim 1, wherein the light emitting layer and the second electrode are disposed to correspond to the shape of the light extraction pattern.

10. A light emitting display apparatus, comprising:
an overcoating layer on a substrate and including a base portion and a protrusion portion;
a light emitting diode on the overcoating layer and including a first electrode, a light emitting layer, and a second electrode;
a bank layer between the first electrode and the light emitting layer, and defining an emission area; and
an encapsulation part on the light emitting diode and including a first encapsulation layer, a foreign material cover layer planarizing an upper portion of the light emitting diode, and a second encapsulation layer,
wherein an upper surface of the bank layer includes an inclined surface extending from the emission area, a plane surface spaced apart from the inclined surface, and a concave pattern or a convex pattern on the plane surface adjacent to the inclined surface to improve a light extraction efficiency and a front efficiency for light emitted from the light emitting diode,
wherein the first encapsulation layer is disposed between the light emitting diode and the foreign material cover layer, and the first encapsulation layer includes a pattern having a shape corresponding to a shape of the concave pattern or the convex pattern, and
wherein a refractive index of the bank layer is smaller than a refractive index of the light emitting layer, and a refractive index of the foreign material cover layer is smaller than a refractive index of the first encapsulation layer.

11. The light emitting display apparatus of claim 10, wherein the concave pattern or the convex pattern surrounds the emission area.

12. The light emitting display apparatus of claim 10, wherein the concave pattern or the convex pattern is disposed on the protrusion portion of the overcoating layer and the first electrode.

13. The light emitting display apparatus of claim 10, wherein a slope of the concave pattern or the convex pattern adjacent to the inclined surface is steeper than a slope of the inclined surface adjacent to the concave pattern or the convex pattern.

14. The light emitting display apparatus of claim 10, wherein
the light emitting layer, the second electrode, and the first encapsulation layer are disposed to correspond to the shape of the concave pattern or the convex pattern.

15. The light emitting display apparatus of claim 10, wherein the shape of the concave pattern or the convex pattern has one of a semicircle, a pattern with a concave or convex side surface, a triangle, and a trapezoid.

16. A light emitting display apparatus, comprising:
an overcoating layer including a base portion and a protrusion portion;
a first electrode disposed to cover the base portion and a side portion of the protrusion portion;
a bank layer on a part of the first electrode;
a light emitting layer on the first electrode and the bank layer;
a second electrode on the light emitting layer;
a foreign material cover layer planarizing an upper portion of the second electrode; and
a first encapsulation layer between the second electrode and the foreign material cover layer,
wherein the bank layer includes:
a first part on the protrusion portion of the overcoating layer;
a second part surrounding the first part and including an inclined upper surface; and
a light extraction pattern on the first part adjacent to the second part,
wherein the first encapsulation layer includes a pattern having a shape corresponding to a shape of the light extraction pattern,
wherein a refractive index of the bank layer is smaller than a refractive index of the light emitting layer, and a refractive index of the foreign material cover layer is smaller than a refractive index of the first encapsulation layer, and
wherein the first electrode is configured to reflect light emitted from the light emitting layer toward the second electrode.

17. The light emitting display apparatus of claim 16, wherein the first electrode includes a reflective layer and the reflective layer covers the base portion and the side portion of the protrusion portion.

18. The light emitting display apparatus of claim 16, wherein:

the light emitting layer includes a first protrusion pattern corresponding to the light extraction pattern of the bank layer; and the second electrode includes a second protrusion pattern corresponding to the first protrusion pattern.

19. The light emitting display apparatus of claim 16, wherein:

the light emitting layer includes a first protrusion pattern corresponding to the light extraction pattern of the bank layer;

the second electrode includes a second protrusion pattern corresponding to the first protrusion pattern; and the pattern of the first encapsulation layer corresponds to the second protrusion pattern.

* * * * *